United States Patent
Aoyama et al.

(10) Patent No.: US 12,089,340 B2
(45) Date of Patent: Sep. 10, 2024

(54) ELECTRONIC COMPONENT MOUNTING DEVICE FOR MOUNTING ELECTRONIC COMPONENTS AT CERTAIN INTERVALS

(71) Applicant: HALLYS CORPORATION, Akashi (JP)

(72) Inventors: Hiroshi Aoyama, Akashi (JP); Toru Hayashida, Akashi (JP)

(73) Assignee: HALLYS CORPORATION, Akashi (JP)

( * ) Notice: Subject to any disclaimer, the term of this patent is extended or adjusted under 35 U.S.C. 154(b) by 0 days.

(21) Appl. No.: 17/612,933

(22) PCT Filed: May 18, 2020

(86) PCT No.: PCT/JP2020/019679
§ 371 (c)(1),
(2) Date: Nov. 19, 2021

(87) PCT Pub. No.: WO2020/235535
PCT Pub. Date: Nov. 26, 2020

(65) Prior Publication Data
US 2022/0232745 A1    Jul. 21, 2022

(30) Foreign Application Priority Data

May 21, 2019   (JP) .................. 2019-095593

(51) Int. Cl.
*H05K 13/04* (2006.01)
*H05K 13/00* (2006.01)

(52) U.S. Cl.
CPC ..... *H05K 13/0482* (2013.01); *H05K 13/0053* (2013.01); *H05K 13/0409* (2018.08); *H05K 13/041* (2018.08)

(58) Field of Classification Search
CPC ........... H05K 13/0053; H05K 13/0409; H05K 13/041; H05K 13/043; H05K 13/0478; H05K 13/0482
See application file for complete search history.

(56) References Cited

U.S. PATENT DOCUMENTS

2003/0071109 A1   4/2003  Arikado
2009/0158564 A1   6/2009  Aoyama et al.
(Continued)

FOREIGN PATENT DOCUMENTS

JP      56-36196 A       4/1981
JP      2006-173190 A    6/2006
(Continued)

OTHER PUBLICATIONS

Extended European Search Report of Jun. 5, 2023 of corresponding European Patent Application No. 20809056.3.
(Continued)

*Primary Examiner* — Minh N Trinh
(74) *Attorney, Agent, or Firm* — Global IP Counselors, LLP

(57) ABSTRACT

An electronic component mounting device is provided for mounting, at different intervals from each other on attachments, a plurality of electronic components which have been placed in a predetermined portion. The electronic component mounting device comprises a removal mechanism for removing some of the plurality of the electronic components being placed in the predetermined portion, a transport mechanism for transporting the electronic components removed by the removal mechanism, moving the electronic components such that, before reaching the attachments, the plurality of the electronic components are at the different intervals at which they will be mounted on the attachments, and transporting the electronic components to the attachments, and a mounting and transfer mechanism for mount- (Continued)

ing the electronic components, which have been transported by the transport mechanism, on predetermined positions of the attachments.

21 Claims, 21 Drawing Sheets

(56) References Cited

U.S. PATENT DOCUMENTS

| | | | |
|---|---|---|---|
| 2011/0162189 A1* | 7/2011 | Noda | H01L 21/67144 29/700 |
| 2012/0036711 A1 | 2/2012 | Ban et al. | |
| 2012/0123575 A1 | 5/2012 | Shim | |
| 2015/0208560 A1 | 7/2015 | Baba et al. | |
| 2020/0388516 A1* | 12/2020 | Aoyama | H01L 21/4853 |

FOREIGN PATENT DOCUMENTS

| | | | |
|---|---|---|---|
| JP | 2018-060993 A | 4/2018 | |
| TW | 200729372 A | 8/2007 | |
| WO | WO-0158233 A1 * | 8/2001 | G02F 1/1303 |
| WO | 2008/052879 A1 | 5/2008 | |
| WO | 2010/032427 A1 | 3/2010 | |
| WO | 2016/125245 A1 | 8/2016 | |

OTHER PUBLICATIONS

International Search Report in PCT/JP2020/019679, dated Jul. 21, 2020.

* cited by examiner

ELECTRONIC COMPONENT MOUNTING DEVICE FOR MOUNTING ELECTRONIC COMPONENTS AT CERTAIN INTERVALS

CROSS-REFERENCE TO RELATED APPLICATIONS

This application is a U.S. National stage of International Application No. PCT/JP2020/019679 filed on May 18, 2020. This application claims priority to Japanese Patent Application No. 2019-095593 filed on May 21, 2019. The entire disclosure of Japanese Patent Application No. 2019-095593 are hereby incorporated herein by reference.

BACKGROUND

Field of the Invention

The present invention relates to an electronic component mounting device, a method for manufacturing an electronic device, and a method for manufacturing a strap.

Background Information

Known is a method for manufacturing an electronic device, the method including manufacturing an electronic device by mounting at least one of a large number of electronic components, which are placed in close contact with one another in a predetermined portion, on an attachment. For example, such a manufacturing method may also be used when an IC chip is mounted on an electronic device.

When IC chips are manufactured, a semiconductor wafer is cut by a laser or the like into a large number of chips. In a state in which the semiconductor wafer has been cut into a large number of IC chips, the large number of the IC chips are arranged in a plurality of columns and a plurality of rows without gaps therebetween.

Known is a method in which, to mount IC chips obtained from such a semiconductor wafer on attachments, the IC chips are individually removed from the semiconductor wafer, and the IC chips, which have been removed, are individually mounted on the attachments.

Furthermore, Japanese Unexamined Patent Application Publication No. 2006-173190 proposes a method in which a plurality of IC chips are placed on an elastic sheet, intervals between the respective IC chips are adjusted by stretching the sheet, and each of the IC chips is mounted on an antenna on an antenna sheet (an attachment) on which a plurality of antennas or the like are formed at a predetermined interval from one another.

In addition, depending on the kind of electronic components, a method using a plate provided with a plurality of depressions into which the respective electronic components are fit is also known. In this method, the depressions of the plate are formed at positions corresponding to a plurality of attachment positions of an attachment, a large number of electronic components are placed on the plate, and the plate is shaken or tilted to fit the electronic components into the depressions of the plate, whereby the electronic components in the depressions are mounted on the attachment.

However, all of the above-mentioned conventional methods have the following problems.

Specifically, in the method of individually removing and mounting the IC chips, since the electronic components need to be removed and mounted on the attachments one by one, the efficiency is low and the productivity cannot be increased.

Furthermore, the method using the elastic sheet has a problem in that the IC chips cannot be properly mounted on the antennas unless positions of the IC chips at a time of dicing, positions of the IC chips on the sheet, a uniform stretching property of the sheet, and the like are controlled in a highly accurate manner. Moreover, when the kind of antenna sheet serving as the attachment is changed, intervals between the IC chips adjacent to one another are changed; such a change requires a review of the kind of antenna sheet or its stretching property each time the change is performed, and manufacture of a wide variety of products may cause an increase in cost.

Moreover, in the method using the plate provided with the depressions, the mounting positions of the electronic components vary depending on the kind of the attachment; therefore, a plate corresponding to the attachment is necessary, it takes significant time to prepare and replace the plate, and manufacture of a wide variety of products may cause an increase in cost.

SUMMARY

The present invention has been made in view of the foregoing problems, and an object of the present invention is to provide an electronic component mounting device and a method for manufacturing an electronic device, both of which enable efficient, highly accurate mounting of electronic components on attachments, and also enable easy configuration in response to a change in kind of the attachment.

An aspect of the invention made to solve the foregoing problems is an electronic component mounting device for mounting, at different intervals from each other on attachments, a plurality of electronic components which have been placed in a predetermined portion, the electronic component mounting device including:

a removal mechanism for removing some of the plurality of the electronic components being placed in the predetermined portion;

a transport mechanism for transporting the electronic components removed by the removal mechanism, moving the electronic components such that, before reaching the attachments, the plurality of the electronic components are at the different intervals at which they will be mounted on the attachments, and transporting the electronic components to the attachments; and a mounting and transfer mechanism for mounting the electronic components, which have been transported by the transport mechanism, on predetermined positions of the attachments.

In the electronic component mounting device, the removal mechanism removes the plurality of the electronic components; the transport mechanism transports the removed electronic components, moves the electronic components such that, before reaching the attachments, the plurality of the electronic components are at the different intervals at which they will be mounted on the attachments, and transports the electronic components to the attachments; and the mounting and transfer mechanism mounts the electronic components, which have been transported by the transport mechanism, on the predetermined positions of the attachments. In this manner, in the electronic component mounting device, the plurality of the electronic components can be simultaneously placed on the attachments, whereby the electronic components can be efficiently mounted. Furthermore, even in a case in which intervals between attachment positions of the attachments are changed owing to a change in kind of the attachment or the like, the electronic component mounting device can be configured in such a manner that the transport mechanism simply changes the intervals between the electronic components. Moreover, the electronic component mounting device can mount the electronic components more accurately than a conventional device using the elastic sheet.

In the electronic component mounting device, the transport mechanism preferably includes: an alignment portion in which the electronic components are positioned in a plurality of columns having the different intervals therebetween; a first transfer mechanism for holding the electronic components removed by the removal mechanism and moving these electronic components to the alignment portion; and a second transfer mechanism for transferring the electronic components moved to the alignment portion to the mounting and transfer mechanism. In the electronic component mounting device, the electronic components can be temporarily stored in the alignment portion between the removal mechanism and the mounting and transfer mechanism, in a plurality of columns comprising the different intervals therebetween; therefore, for example, even when the electronic components are inspected, an influence of such an inspection on the mounting can be reduced. Furthermore, the first transfer mechanism can temporarily store the electronic components in the alignment portion in an arrangement that facilitates the mounting of the electronic components on the attachments, thereby increasing the mounting efficiency.

In the electronic component mounting device, it is preferred that the first transfer mechanism moves the electronic components to the alignment portion and places them therein such that the electronic components are arranged in a plurality of columns having the different intervals therebetween, the second transfer mechanism transports a plurality of the electronic components in one row from the alignment portion while keeping the different intervals between the electronic components, and the mounting and transfer mechanism mounts the electronic components on the attachments with the different intervals between the electronic components. In the electronic component mounting device, the first transfer mechanism removes the plurality of the electronic components from a placement base by simultaneously sucking the electronic components, and moves the electronic components to the alignment portion and places them therein. The placement in the alignment portion by the first transfer mechanism is repeated a plurality of times, and the electronic components are arranged in the plurality of the columns having the different intervals therebetween. Then, the second transfer mechanism removes the plurality of the electronic components in the one row from the alignment portion by simultaneously sucking the electronic components having the different intervals therebetween, and simultaneously places the plurality of the electronic components in the one row on the attachments. In this manner, in the electronic component mounting device, the plurality of the electronic components can be simultaneously placed on the attachments, whereby the electronic components can be efficiently mounted. Furthermore, even in a case in which the intervals between the attachment positions of the attachments are changed owing to a change in kind of the attachment or the like, the electronic component mounting device can be configured simply by changing the interval between the columns of the electronic components to be placed in the alignment portion. Moreover, the electronic component mounting device can mount the electronic components more accurately than the conventional device using the elastic sheet. When the second transfer mechanism holds the plurality of the electronic components in the one row, not all the electronic components arranged in the one row are necessarily held and transferred. For example, the second transfer mechanism may also hold and transfer the electronic components arranged in the one row, with predetermined intervals between columns, in such a manner that the electronic components in odd-numbered columns are held and transferred separately from those in even-numbered columns.

It is preferred that: the second transfer mechanism includes a removal unit which removes a plurality of electronic components from the alignment portion by simultaneously sucking the plurality of the electronic components in one row, and a temporary storage portion to which the plurality of the electronic components in the one row, having been removed by the removal unit, are delivered; and that the mounting and transfer mechanism sucks the plurality of the electronic components in the one row, having been delivered to the temporary storage portion, and mounts the electronic devices on the attachments. In this manner, the second transfer mechanism includes the temporary storage portion, whereby a timing at which the removal unit receives the electronic components from the alignment portion, a timing at which the removal unit delivers the electronic components to the temporary storage portion, a timing at which the mounting and transfer mechanism receives the electronic component from the temporary storage portion, and a timing at which the mounting and transfer mechanism mounts the electronic components on the attachments can be controlled; thus, the electronic components can be mounted more efficiently.

The second transfer mechanism preferably further includes an inversion unit on which the plurality of the electronic components in the one row are placed from the removal unit and which inverts the electronic components placed thereon and delivers the electronic components to the temporary storage portion. Front and rear sides of some electronic components are differentiated (for example, a circuit may be formed on only one side); even in such a case, since the second transfer mechanism includes the inversion unit, the electronic components can be placed on the attachments with desired surfaces of the electronic components facing the attachments.

The temporary storage portion preferably includes a correction unit which corrects positions of the electronic components placed in the temporary storage portion. Thus, by the temporary storage portion, the electronic components can be placed on the attachments in more accurate positions than a state in which the electronic components were placed in the alignment portion.

The second transfer mechanism preferably simultaneously sucks the electronic components in a plurality of rows from the alignment portion. Thus, the second transfer mechanism can remove the electronic components from the alignment portion more efficiently.

The second transfer mechanism preferably simultaneously places the electronic components in the plurality of the rows on the attachments. Thus, the second transfer mechanism can mount the electronic components more efficiently.

The alignment portion preferably moves the electronic components placed therein between: a first delivery position at which the electronic components are delivered from the first transfer mechanism, and a second delivery position at which the electronic components are delivered to the second transfer mechanism. Thus, the degree of freedom in positions at which components of the first transfer mechanism and components of the second transfer mechanism are provided is increased.

The first transfer mechanism preferably includes a sucking and holding device capable of changing a number of the electronic components to be sucked. Thus, the number of the electronic components to be sucked by the first transfer mechanism from the placement base can be changed.

The plurality of the electronic components held by the second transfer mechanism are preferably arranged in a direction parallel to a direction in which the plurality of the attachments on which the electronic components are to be mounted are arranged. Thus, the second transfer mechanism can transfer the electronic components placed in the alignment portion to the mounting and transfer mechanism, and the mounting and transfer mechanism can easily and surely mount the electronic components on the predetermined positions of the attachments.

The transport mechanism preferably includes a plurality of alignment portions, each of the plurality of the alignment portions being capable of being disposed at a placement position and a removal position. Since the transport mechanism can be disposed at either the placement position or the removal position, any of the alignment portions can be disposed at either the placement position or the removal position at any time. Thus, placement and removal of the electronic components can be performed at any time, and are therefore efficient. Moreover, the placement and the removal can be efficiently separated from each other; therefore, for example, by providing one removal position and two placement positions, the removal can be performed at any time, and is therefore efficient.

The second transfer mechanism preferably transports the electronic components with intervals between the electronic components being the different intervals. Thus, the second transfer mechanism can easily and surely transport the electronic components.

The second transfer mechanism preferably transports a plurality of rows of the electronic components when performing one transportation operation, with interval patterns in the plurality of rows of the electronic components being different. Thus, the second transfer mechanism can transport the plurality of rows of the electronic components having the different interval patterns by one transportation operation.

The removal mechanism preferably removes the plurality of the electronic components with the plurality of the electronic components being arranged in one column.

Each of the electronic components is preferably an IC chip to be used for an RFID device or a strap on which an IC chip is mounted. Thus, the electronic component mounting device can easily and surely manufacture an RFID device.

The plurality of the electronic components are preferably placed on a placement base to be in close contact with one another. Thus, a large number of electronic components can be placed on the placement base. It is to be noted that "close contact" as referred to herein means that things are tightly packed together such that there are substantially no gaps.

The removal mechanism preferably sucks and holds the electronic components. Thus, the removal mechanism can easily and surely remove the plurality of the electronic components.

The mounting and transfer mechanism preferably mounts the plurality of the electronic components on the attachments at positions in which the electronic components are at the same height. Thus, the mounting and transfer mechanism can easily and surely mount the plurality of the electronic components on the attachments.

The electronic component mounting device preferably further includes an attachment position verification member which verifies attachment positions of the attachments before the electronic components are mounted. Thus, the electronic component mounting device can calculate intervals between the attachment positions based on the attachment positions of the attachments, which have been verified by the attachment position verification member, and mount the electronic components based on the calculated intervals.

The attachment positions can be in a repeating pattern with intervals which differ in a row direction. The electronic component mounting device can also be suitably used with attachments in the attachment positions being in the repeating pattern with the intervals which differ in the row direction.

A pattern of the different intervals may also be such that it is not repeated in the row direction. The electronic component mounting device can also be suitably used with attachments having the pattern of the different intervals which is not repeated.

Another aspect of the invention made to solve the foregoing problems is a method for manufacturing an electronic device, wherein a plurality of electronic components placed in a predetermined portion are mounted on attachments at different intervals from each other, the method comprising:
    removing some of the plurality of the electronic components being placed in the predetermined portion;
    transporting, wherein the electronic components removed in the removing are transported, the electronic components are moved so that the plurality of the electronic components are at the different intervals at which they will be mounted on the attachments before reaching the attachments, and the electronic components are transported to the attachments; and
    mounting and transferring, wherein the electronic components transported in the transporting are mounted on predetermined positions of the attachments.

In the method for manufacturing an electronic device, some of the plurality of the electronic components having been placed in the predetermined portion are removed, the electronic components having been removed are transported, the electronic components are moved so that intervals between the electronic components adjacent to one another are, respectively, the different intervals before reaching the attachments, the electronic components are transported to the attachments, and the electronic components having been transported are mounted on the predetermined positions of the attachments, whereby an electronic device can be easily and surely manufactured.

In the method for manufacturing an electronic device, the transporting preferably includes mounting the electronic components in a first interval pattern, and mounting the electronic components in a second interval pattern which differs from the first interval pattern. When the transporting includes mounting the electronic components in the first interval pattern, and mounting the electronic components in the second interval pattern which differs from the first interval pattern, a plurality of the electronic components are efficiently mounted on the predetermined positions, whereby the electronic device can be more easily and surely manufactured.

A yet another aspect of the invention made to solve the foregoing problems is a method for manufacturing an electronic device, wherein a plurality of electronic components are simultaneously mounted on attachments at different intervals from each other, the method including:
- removing, wherein the plurality of the electronic components are removed from a predetermined portion and held;
- a first transporting, wherein the plurality of the electronic components removed in the removing are transported to an alignment portion, and the electronic components are placed on the alignment portion;
- a second transporting, wherein the electronic components placed on the alignment portion are transported to the attachments while being held; and
- mounting and transferring, wherein the electronic components transported in the second transporting are mounted on predetermined positions of the attachments.

In the method for manufacturing an electronic device, the plurality of the electronic components are removed from the predetermined portion and held, the plurality of the electronic components having been removed are transported to the alignment portion, the electronic components are placed on the alignment portion, the electronic components placed on the alignment portion are transported to the attachments while being held, and the electronic components having been thus transported are mounted on the predetermined positions of the attachments, whereby an electronic device can be easily and surely manufactured.

In the method for manufacturing an electronic device, in the first transporting, the electronic components are preferably placed on the alignment portion such that the plurality of the electronic components arranged in columns can be transported in the second transporting. Thus, the plurality of the electronic components can be easily and surely transported in the second transporting.

A still another aspect of the invention made to solve the foregoing problems is a method for manufacturing an electronic device, wherein a plurality of electronic components are simultaneously mounted on attachments at different intervals from each other, the method including:
- removing the plurality of the electronic components from a predetermined portion;
- holding, wherein the plurality of the electronic components removed in the removing are arranged at the different intervals at which they will be mounted on the attachments, and held by a transport mechanism;
- transporting the electronic components being held by the transport mechanism to the attachments; and
- mounting and transferring, wherein the electronic components transported in the transporting are mounted on predetermined positions of the attachments.

In the method for manufacturing an electronic device, the plurality of the electronic components are removed from the predetermined portion, the plurality of the electronic components having been removed are each arranged at the predetermined interval from one another and held by the transport mechanism, the electronic components being held by the transport mechanism are transported to the attachments, and the electronic components having been transported are mounted on the predetermined positions of the attachments, whereby an electronic device can be easily and surely manufactured.

A further of the aspect made to solve the foregoing problems is a method for manufacturing a strap to be used for an RFID device, the method including:
- transporting an electrode sheet to a predetermined position, the electrode sheet having formed thereon a pair of electrodes spaced apart by a predetermined gap along a longitudinal direction,
- arranging a plurality of IC chips in a plurality of columns with intervals therebetween,
- and transporting the plurality of the IC chips to the predetermined position while holding the plurality of the IC chips in the columns, and placing the IC chips to be in contact with the pair of electrodes and positioned on the gap between the pair of electrodes.

In the method for manufacturing a strap, the plurality of IC chips are placed, by the placing, on the electrode sheet which has been transported by the transporting to the predetermined position, whereby an electronic device in which the IC chips are positioned to be in contact with the pair of electrodes and positioned on the gap between the pair of electrodes can be easily and surely produced.

As set forth above, the electronic component mounting device, the method for manufacturing an electronic device, and the method for manufacturing a strap according to the aspects of the present invention enable efficient, highly accurate mounting of an electronic component on an attachment, and also enable easy configuration in response to a change in kind of the attachment.

BRIEF DESCRIPTION OF THE DRAWINGS

FIGS. 14A and 14B are schematic front views of a transfer mechanism according to another embodiment of the present invention, wherein FIG. 14A shows a state in which intervals between suction cylinders are large, and FIG. 14B shows a state in which the intervals between the suction cylinders are small.

DETAILED DESCRIPTION OF EMBODIMENTS

Figure 1:
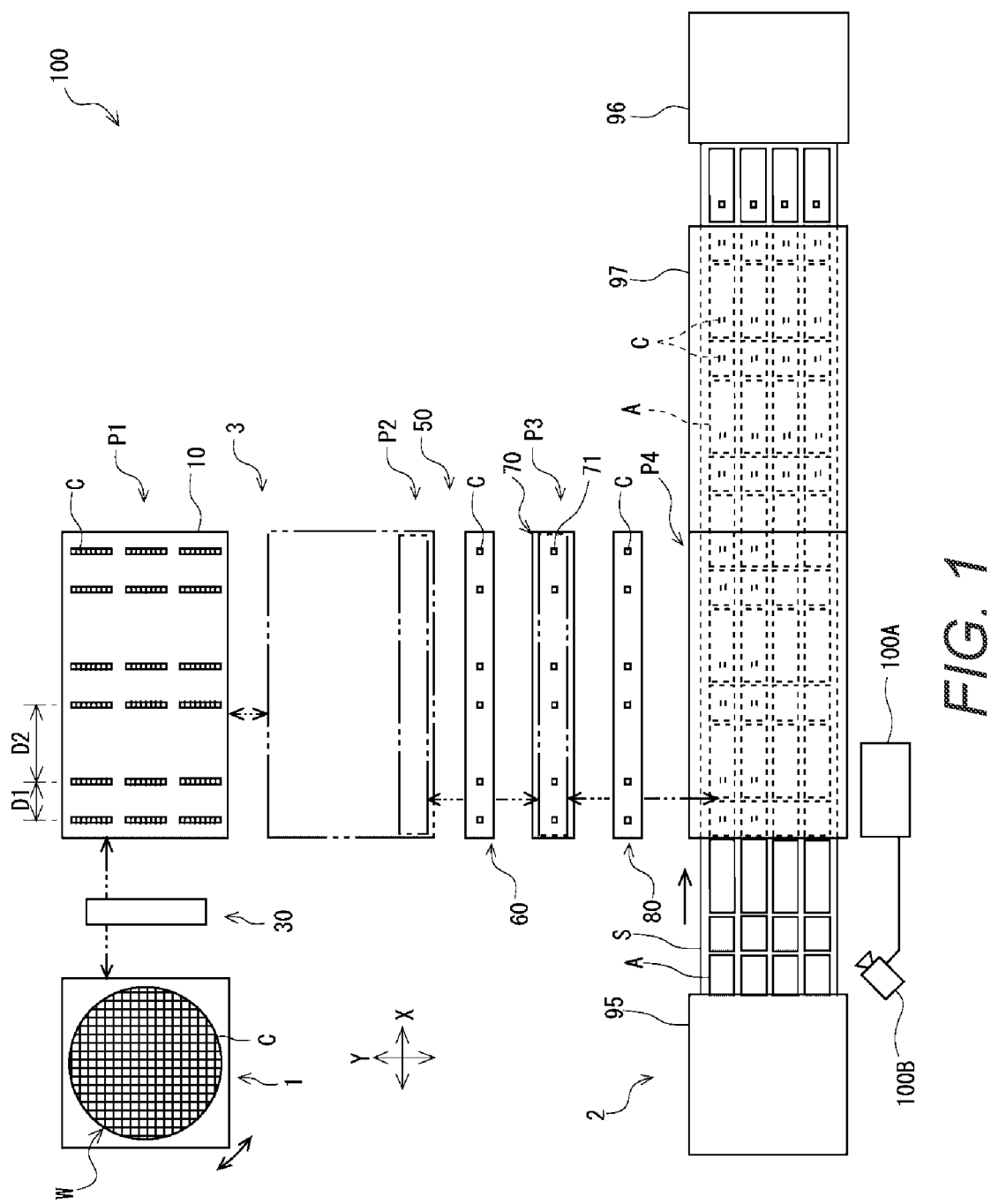
FIG. 1 is a schematic plan view showing a structure of an electronic component mounting device according to an embodiment of the present invention.

Hereinafter, an embodiment of the present invention will be described in detail with reference to the drawings as appropriate; however, the present invention is not limited to a structure of the following embodiment.

Electronic Component Mounting Device

FIGS. 1 to 6 show a whole or a part of an electronic component mounting device 100 according to an embodiment of the present invention. The electronic component mounting device 100 is an electronic component mounting device in which a plurality of electronic components which have been placed in a predetermined portion are mounted at different intervals from each other on attachments. In the electronic component mounting device 100, electronic components are removed from a large number of electronic components C which are arranged in close contact with one another in a plurality of columns and a plurality of rows, and the electronic components (here, IC chips C) are mounted on attachments (in this embodiment. RFID tags A). The terms "rows" and "columns" as referred to herein mean an array in an X direction and an array in a Y direction in FIG. 1, respectively. Description will be given below, taking IC chips as an example of the electronic components. The IC chips C are formed, for example, in such a manner that a thin disc-shaped semiconductor wafer W on which a large number of circuit patterns are formed is cut in a grid pattern. In the electronic component mounting device 100, a plurality of IC chips C are removed column by column from a large number of IC chips C aligned without gaps between the plurality of the columns and the plurality of the rows, and the IC chips C having been removed are mounted on their respective RFID tags A. It is to be noted that each of the drawings is a schematic view and schematically illustrates the size, the number, and the like of each part of the electronic component mounting device.

Overall Structure

The electronic component mounting device 100 includes a placement base 1 on which the semiconductor wafer W is placed; a sheet transport mechanism 2 for transporting a sheet of the RFID tags A, which are the attachments; a component transport mechanism 3 for transporting the IC chips C, which are the electronic components, from the placement base 1 to the sheet transport mechanism 2; and a mounting and transfer mechanism 80 for mounting and transferring the IC chips C, which have been transported by the component transport mechanism 3, onto the RFID tags A. Furthermore, the electronic component mounting device 100 includes a control portion 100A which controls operation of each part of the electronic component mounting device.

Placement Base

As described above, the IC chips C, which are obtained by cutting the semiconductor wafer W into pieces by a laser or the like and are arranged without gaps between the plurality of the columns and the plurality of the rows, are placed on the placement base 1. Furthermore, the placement base 1 includes an adjustment unit which adjusts an alignment direction of the IC chips C placed thereon. Specifically, the placement base 1 includes an imaging portion (not shown) which images the semiconductor wafer W placed thereon and a rotating portion (not shown) which, in a case in which an alignment direction of the electronic components C is misaligned (in a case in which the alignment direction is inconsistent with an XY direction in FIG. 1), rotates the semiconductor wafer W around a rotational axis that passes through a center of the placement base 1 and extends in a direction orthogonal to the paper surface of FIG. 1.

Component Transport Mechanism

The component transport mechanism 3 includes a sucking and holding device 33 as a removal mechanism for picking up and removing the plurality of the IC chips C, and the component transport mechanism 3 for transporting the IC chips C, which have been removed by the sucking and holding device 33, moving the IC chips C so that intervals between the IC chips C adjacent to one another are, respectively, the different intervals (the intervals at which the plurality of the IC chips C are to be mounted on the RFID tags A) before reaching the RFID tags A, and transporting the IC chips C to the RFID tags A. Specifically, the component transport mechanism 3 includes a placement table 10 serving as an alignment portion which is between the placement base 1 and the sheet transport mechanism 2 and in which the IC chips C are temporarily stored; a first transfer mechanism 30 for transferring the IC chips C from the placement base 1 to the placement table 10; and a second transfer mechanism 50 for transferring the IC chips C from the placement table 10 to the RFID tags A. In the component transport mechanism 3, the IC chips C on the placement base 1 are first moved to the placement table 10 by the first transfer mechanism 30 to be temporarily placed on the placement table 10, and the IC chips C on the placement table 10 are transported to antennas of the RFID tags A by the second transfer mechanism 50. In this embodiment, the first transfer mechanism 30 transfers the IC chips C in a first direction (the X direction in FIG. 1), and the second transfer mechanism 50 transfers the IC chips C in a second direction (the Y direction in FIG. 1) orthogonal to the first direction.

With regard to the first transfer mechanism 30, the IC chips C are moved from the placement base 1 to the placement table 10 such that the different intervals D1 and D2 are between columns of the IC chips C on the placement table 10. The first transfer mechanism 30 simultaneously sucks a plurality (in this embodiment, eight) of the IC chips C from the placement base 1. Then, the first transfer mechanism delivers the sucked IC chips C to the placement table 10 such that on the placement table 10, the intervals D1 and D2 between the columns of the IC chips alternate in the following pattern: D1, D2, D1, D2, D1. This pattern of D1, D2, D1, D2, D1 is referred to hereinafter as "the pattern of the different intervals D1 and D2." By repeating these sucking and placing actions, a plurality of columns of the IC chips C are arranged such that the pattern of the different intervals D1 and D2 is present between the respective columns of the IC chips C. The second transfer mechanism 50 is a mechanism for simultaneously sucking a plurality (in this embodiment, six) of the IC chips C in one row from the placement table 10, on which the IC chips C are thus arranged with the pattern of the different intervals D1 and D2 between the respective columns, and transporting the plurality of the IC chips C in the one row to the antennas of the RFID tags A.

That is to say, in the component transport mechanism 3 of this embodiment, through a plurality of operations of transferring the IC chips C from the placement base 1 to the placement table 10, the IC chips C are arranged in a predetermined number of columns (in the example shown, six columns) on the placement table 10 with the pattern of the different intervals D1 and D2 between the plurality of columns of the IC chips C. The predetermined number of columns is equal to the number of IC chips C which are to be simultaneously placed on the RFID tags A. In this manner, the second transfer mechanism 50 removes the plurality (in the example in the drawing, six per row (six columns)) of the IC chips C in the one row from the placement table 10, on which the IC chips C are aligned in the pattern of the different intervals D1 and D2, and the IC chips C are transferred to the antennas of the RFID tags A and placed on the RFID tags A.

Placement Table

As set forth above, the placement table 10 receives the IC chips C from the first transfer mechanism 30, and the IC chips C are received by the second transfer mechanism 50. The placement table 10 slides to approach or be separated from the second transfer mechanism 50. In other words, the placement table 10 moves between a first delivery position P1 which is farther from the second transfer mechanism 50 and at which the IC chips C are delivered from the first transfer mechanism 30, and a second delivery position P2 which is closer to the second transfer mechanism 50 and at which the IC chips C are delivered to the second transfer mechanism 50. It is to be noted that the placement table 10 is supported to be slidable by a rail (not shown) provided between the first delivery position P1 and the second delivery position P2.

First Transfer Mechanism

Figure 2:
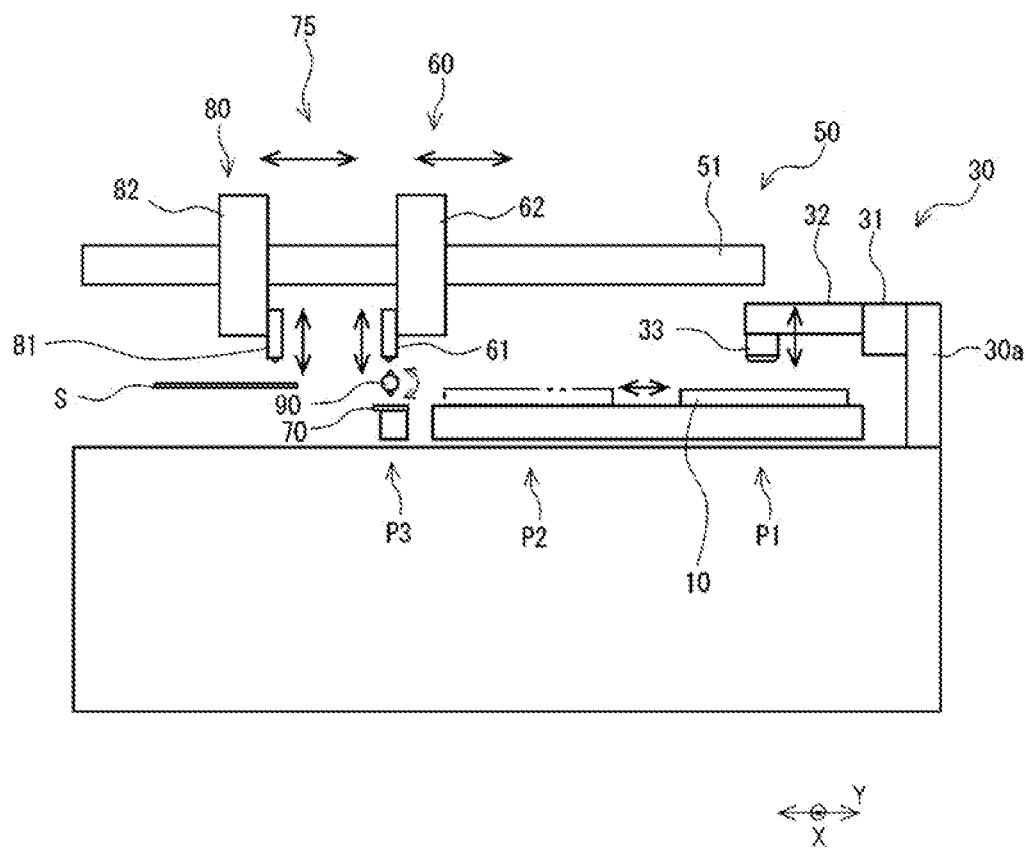
FIG. 2 is a schematic side view of an electronic component mounting device.

The first transfer mechanism 30 simultaneously removes eight IC chips C arranged in one column from the placement base 1 and moves the IC chips to the placement table 10. The first transfer mechanism 30 includes the sucking and holding device 33, which can move in a horizontal direction (the X direction and the Y direction in FIGS. 1 and 2) and a vertical direction (the direction orthogonal to the paper surface of FIG. 1) (see FIG. 2). Furthermore, as shown in FIG. 2, the first transfer mechanism 30 includes a column portion 30a, a traveling body 31, and a vertically moving object 32. The column portion 30a is provided with a rail along a transfer direction of the first transfer mechanism 30. The traveling body 31 travels along the column portion 30a. The vertically moving object 32 is supported by the traveling body 31 to be vertically movable and supports the sucking and holding device 33 so that the sucking and holding device is movable in a vertical direction (the Y direction in FIGS. 1 and 2) with respect to a transport direction of the first transfer mechanism 30.

Sucking and Holding Device

As set forth above, the sucking and holding device 33 can suck the plurality of the IC chips C arranged in the one column from the placement base 1 and hold the IC chips C. The sucking and holding device 33 can change the number of IC chips C to be sucked. As shown in FIGS. 3 to 6, the sucking and holding device 33 includes a suction tool 34 in which a degassing port 36 is formed (see FIG. 4) and a displacement body 42 which is displaced (rotated) relative to the suction tool 34. A suction port 38 (see FIGS. 4 and 5) exerts a suction force by communicating with the degassing port 36. The displacement body 42 is provided to be able to selectively change a communication state between a plurality of the suction ports 38 and the degassing port 36, depending on a position relative to the suction tool 34.

The suction tool 34 includes a negative pressure chamber 35 (see FIGS. 3 and 4) in which a negative pressure is generated by suction with the degassing port 36. The suction ports 38 are formed to be able to communicate with the negative pressure chamber 35. The displacement body 42 is provided in the negative pressure chamber 35 to be able to selectively change a communication state between the plurality of the suction ports 38 and the negative pressure chamber 35, depending on a rotational position of the displacement body 42 relative to each of the suction ports 38. The displacement body 42 is a cylinder which is rotatable with a peripheral wall thereof being in contact with an inner wall of the negative pressure chamber 35. A plurality of long holes 43 (see FIG. 6) which are each parallel to a rotational axis of the cylinder and have different lengths are formed to penetrate the peripheral wall of the cylinder.

Figure 3:
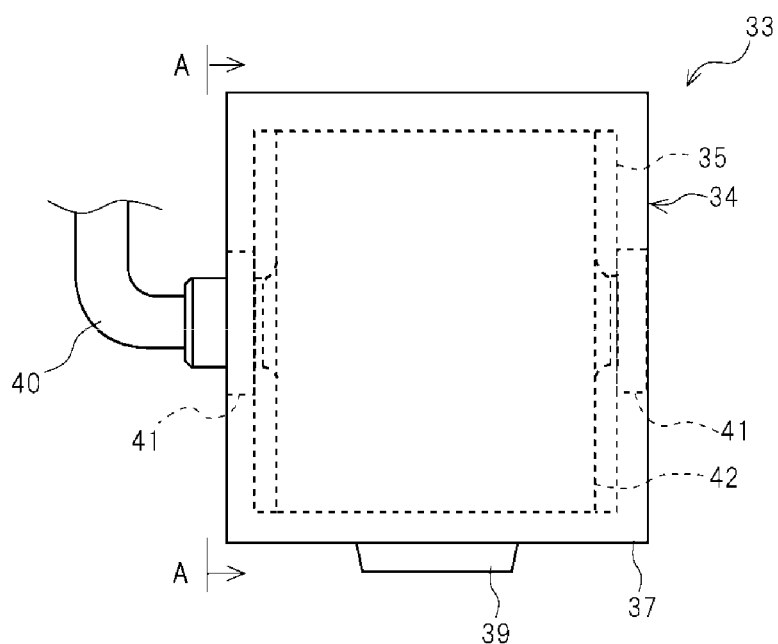
FIG. 3 is a schematic side view of a sucking and holding device used for an electronic component mounting device.
Figure 4:
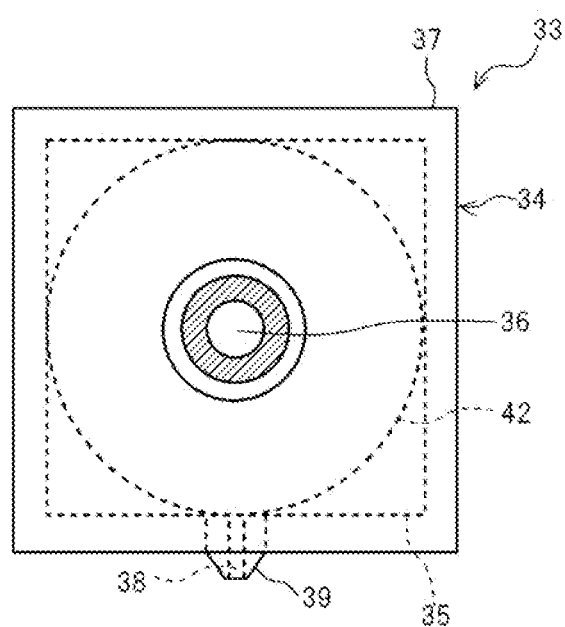
FIG. 4 is a cross-sectional view taken along a line A-A in FIG. 3.
Figure 5:
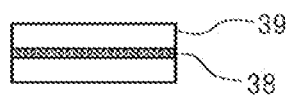
FIG. 5 is a bottom view of a collet portion used for a sucking and holding device.
Figure 6:
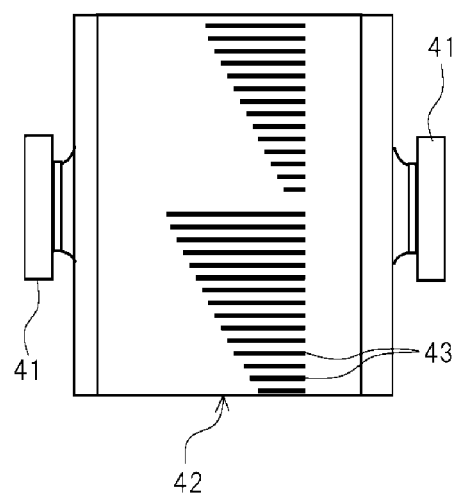
FIG. 6 is a side view of a displacement body used for a sucking and holding device.

More specifically, as shown in FIGS. 3 and 4, the suction tool 34 includes a housing 37 in which the negative pressure chamber 35 and the degassing port 36 are formed, and a collet portion 39 which is attached to a bottom portion of the housing 37 and in which the suction ports 38 are formed. The plurality of the suction ports 38 of the collet portion 39 are configured so that the suction ports 38 are arranged in line in a direction orthogonal to the paper surface of FIG. 4. More particularly, as shown in FIG. 5, which shows a tip side of the collet portion 39, a planar portion is formed on the tip of the collet portion 39, and the plurality of the suction ports 38 are arranged in the planar portion. As shown in FIG. 4, the collet portion 39 is formed to decrease in width toward a lower end. Furthermore, the collet portion 39 is attached to the bottom portion of the housing 37 to be detachable; thus, in response to a change or the like of an object to be sucked, the collet portion 39 in which the suction ports 38 are differently arranged can be newly attached. The suction ports 38 of the collet portion 39 communicate with a hole formed on a bottom face of the negative pressure chamber 35.

As shown in FIG. 3, a suction hose 40 is attached to the suction tool 34, and the suction hose 40 is connected to the degassing port 36. It is to be noted that the suction hose 40 is connected to a pressure reducing unit such as a vacuum pump, a blower, or the like.

The displacement body 42 has a cylindrical shape and, as shown in FIGS. 3 and 4, is provided in the housing 37 to be rotatable with the peripheral wall of the displacement body 42 (a side surface of a cylinder) being in contact with an inner wall (a top face) of the collet portion 39. Therefore, in a case in which the suction ports 38 of the collet portion 39 are in contact with the peripheral wall of the cylinder, the cylinder hinders the communication state between the suction ports 38 and the negative pressure chamber 35. Accordingly, the suction ports 38 in this state cannot suck. Furthermore, the plurality of the long holes 43 are formed on the peripheral wall of the cylinder (see FIG. 6). Since the plurality of the long holes 43 are provided to penetrate the cylinder, in a case in which one of the long holes 43 is located in a portion corresponding to the suction ports 38 of the collet portion 39, the suction ports 38 communicate with the negative pressure chamber 35 through the long holes 43.

Since the plurality of the long holes 43 are each parallel to the rotational axis of the cylinder and have different lengths, the number of suction ports 38 which are to communicate with the negative pressure chamber 35 can be selectively changed by changing, in accordance with an angle of the cylinder relative to the housing 37, the long hole 43 to be located in the portion corresponding to the suction ports 38 of the collet portion 39.

Second Transfer Mechanism

As shown in FIG. 2, the second transfer mechanism 50 includes a removal unit 60 and a temporary storage portion 70. Referring to FIGS. 1 and 2, the removal unit 60 simultaneously sucks and removes the six IC chips C in the one row from the alignment portion 10. The six IC chips C in the one row are delivered to the temporary storage portion 70. In other words, in the second transfer mechanism 50, the removal unit 60 removes the six IC chips C in the one row from the alignment portion 10, the IC chips C having been removed are once temporarily stored in the temporary storage portion 70, and then the IC chips C in the temporary storage portion 70 are transported to an antenna sheet S.

Furthermore, the second transfer mechanism 50 further includes an inversion unit 90 on which a plurality of IC chips C in one row is placed from the removal unit 60 and which inverts the IC chips C placed thereon and delivers the IC chips C to the temporary storage portion 70. In other words, in the second transfer mechanism 50, the inversion unit 90 is provided between the removal unit 60 and the temporary storage portion 70, the IC chips C are first delivered from the removal unit 60 to the inversion unit 90, and the inversion unit 90 inverts the IC chips C upside down and delivers the IC chips C to the temporary storage portion 70. A position at which the IC chips C are delivered to the temporary storage portion 70 may be hereinafter referred to as "third delivery position P3." It is to be noted that the inversion unit 90 is not shown in FIG. 1.

The removal unit 60 simultaneously removes the six IC chips C in the one row from the alignment portion 10 at the second delivery position P2. The removal unit 60 is provided to be movable between the second delivery position P2 and the third delivery position P3; as set forth above, the removal unit 60 receives the IC chips C at the second delivery position P2 and then transfers the IC chips C by moving to the third delivery position P3, and delivers the IC chips C at the third delivery position P3.

The removal unit 60 includes a suction portion 61 which is above the alignment portion 10 (the alignment portion 10 at the second delivery position P2) and the temporary storage portion 70 and is vertically movable, and a support portion 62 which is movable in a horizontal direction (the Y direction FIGS. 1 and 2) and supports the suction portion 61 so that the suction portion 61 is vertically movable. As shown in FIG. 2, the second transfer mechanism 50 includes a rail 51 provided along a column formation direction of the IC chips C (the Y direction), and the support portion 62 is supported to be movable in the horizontal direction along the rail 51.

At the third delivery position P3, the IC chips C are delivered from the removal unit 60 to the inversion unit 90. The inversion unit 90 is provided to be able to suck the IC chips C having been delivered. Furthermore, the inversion unit 90 is provided to be able to invert the IC chips C being sucked and to be vertically movable. Thus, the inversion unit 90 inverts the IC chips C which have been delivered and sucked, vertically moves to approach the temporary storage portion 70, and delivers the IC chips C to the temporary storage portion 70. Furthermore, the inversion unit 90 is provided to be horizontally movable (moveable in a Y direction or an X direction) so as to be farther from the third delivery position P3. Specifically, when the mounting and transfer mechanism 80 receives the IC chips C from the temporary storage portion 70, the inversion unit 90 is farther from the third delivery position P3.

The temporary storage portion 70 includes a correction unit 71 which corrects positions of the IC chips C placed in the temporary storage portion 70. Here, the correction unit 71 is not particularly limited; in the example shown in the drawing, depressions are formed as the correction unit 71 on a top surface of the temporary storage portion 70. That is to say, the IC chips C which have been delivered from the inversion unit 90 are fit into the depressions, whereby the positions of the IC chips C (intervals between the IC chips C adjacent to one another) and angles of the IC chips C are corrected. It is to be noted that the correction units may also be, for example, a pair of plate-like members which are provided to be able to approach or be separated from the IC chips C placed in the temporary storage portion 70, wherein, by approaching the IC chips C, the pair of the plate-like members abut the IC chips C, thereby interposing them therebetween. In this embodiment, the temporary storage portion 70 does not move in a direction in which the second transfer mechanism 50 transfers the IC chips C (the Y direction). It is to be noted that it is also possible to provide the temporary storage portion 70 which moves between the second delivery position P2 and the third delivery position P3 and to provide the removal unit 60 which does not move in the Y direction.

A reception and transport mechanism 75 receives the IC chips C at the third delivery position P3 and then transports the IC chips C to the antenna sheet S. The reception and transport mechanism 75 simultaneously receives the plurality of the IC chips C in the one row at the third delivery position P3 from the temporary storage portion 70. The reception and transport mechanism 75 is provided to be movable between the third delivery position P3 and the RFID tags A, on which the IC chips C are to be mounted. In this embodiment, the reception and transport mechanism 75 is configured to receive all the IC chips C placed in the temporary storage portion 70. It is to be noted that the reception and transport mechanism 75 may also be configured to receive some (a plurality) of the IC chips C placed in the temporary storage portion 70. Specifically, for example, the reception and transport mechanism 75 may also be configured to receive four of eight IC chips C in one row placed in the temporary storage portion 70; in this case, two reception and transport mechanisms 75 may be provided to receive the six IC chips C. However, the reception and transport mechanism 75 is preferably configured to simultaneously receive all the plurality of the IC chip C in the one row, which have been simultaneously delivered to the temporary storage portion 70 by the removal unit 60; thus, complexity of the whole device can be avoided, and the mounting can be performed more efficiently.

Mounting and Transfer Mechanism

The mounting and transfer mechanism 80 includes a holding portion 81 which is vertically movable above the RFID tags A, and a moving member 82 which supports the holding portion 81 so that the holding portion 81 is vertically movable. The mounting and transfer mechanism 80 mounts the IC chips C, which have been transported by the component transport mechanism 3 to the antenna sheet S where the RFID tags A are formed, on predetermined positions of the RFID tags A. The moving member 82 is supported to be movable along the rail 51 in the horizontal direction (the Y direction in FIGS. 1 and 2). With regard to the mounting and transfer mechanism 80, the IC chips C are mounted on the RFID tags A in an installation position P4.

Sheet Transport Mechanism

Referring to FIG. 1, as set forth above, the sheet transport mechanism 2 is a mechanism for transporting the antenna sheet S where the RFID tags A, on which the IC chips C are to be mounted, are formed. In this embodiment, the sheet transport mechanism 2 transports the antenna sheet S where a large number of RFID tags A are formed. The sheet transport mechanism 2 transports the antenna sheet S along an alignment direction of the plurality of the IC chips C sucked and held by the mounting and transfer mechanism 80 (a row formation direction in the alignment portion 10 (the X direction in FIG. 1)).

In this embodiment, the plurality of the RFID tags A are formed on the antenna sheet S to be arranged at intervals corresponding to the pattern of the different intervals D1 and D2, that is to say, at the intervals D1, D2, D1, D2, and D1, in a longitudinal direction and a width direction of the sheet (the X direction and the Y direction in FIG. 1). The plurality (in this embodiment, six) of the IC chips C in the one row are simultaneously placed on the plurality of the RFID tags A of the antenna sheet S by the mounting and transfer mechanism 80.

The sheet transport mechanism 2 includes a feeding device 95 which reels out the antenna sheet S from a roll of the antenna sheet S. and a collection device 96 which collects the antenna sheet S on which the IC chips C have been mounted. Between the feeding device 95 and the collection device 96, the IC chips C are transported to the RFID tags A of the antenna sheet S by the component transport mechanism 3. Then, the mounting and transfer mechanism 80 mounts the IC chips C on the RFID tags A. It is to be noted that the collection device 96 can be a winding device which winds the antenna sheet S, a cutting device which cuts the antenna sheet S, and/or the like. Furthermore, the sheet transport mechanism 2 includes a curing device 97 which cures the antenna sheet S on which the IC chips C have been placed in the above-described manner. In addition, the sheet transport mechanism 2 may further include a device which applies a fixing member such as an adhesive, a metal bond, or the like for fixing the IC chips C to the antennas of the RFID tags A.

Attachment Position Verification Member

The electronic component mounting device 100 includes an attachment position verification member 100B, which verifies a position of the antenna sheet S (the plurality of the RFID tags A) before the IC chips C are mounted. The attachment position verification member 100B consists of a camera. The attachment position verification member 100B images the antenna sheet S transported by the sheet transport mechanism 2, the imaging taking place further upstream than the installation position P4. The attachment position verification member 100B is connected to the control portion 100A; the electronic component mounting device 100 can calculate intervals between the RFID tags A based on positions of the RFID tags A verified by the attachment position verification member 100B, and mount the IC chips C based on these calculated intervals.

Method for Manufacturing Electronic Device

Next, a method for manufacturing an electronic device according to an embodiment of the present invention will be described. In the method for manufacturing an electronic device, the IC chips C are mounted using the electronic component mounting device 100 having the above-described structure.

A method for mounting the IC chips C includes a first transporting step in which the IC chips C are transferred from the placement base 1 to the placement table 10 and placed thereon by the first transfer mechanism 30, and a second transporting step in which the IC chips C are transferred from the placement table 10 to the RFID tags A and placed thereon by the second transfer mechanism 50.

First Transporting Step

In the first transporting step, eight IC chips C are simultaneously sucked from the placement base 1, and the IC chips C which have been sucked are transferred and delivered to the placement table 10. The first transporting step is repeated, whereby columns of a plurality of IC chips C are arranged on the placement table 10 with the different intervals D1 and D2 between the respective columns.

In the first transporting step, the sucking and holding device 33 usually sucks a predetermined number (in this embodiment, eight; an appropriate number such as twenty, one hundred, five, etc. is selected in accordance with the size of the IC chip and the electronic component) of IC chips C in one column. However, in a case in which the number of IC chips C on the placement base 1 has been reduced by repetition of the first transporting step and the number of IC chips C in one column on the placement base 1 is less than the predetermined number, the sucking and holding device 33 sucks the IC chips C in a number being less than the predetermined number.

More specific description will be given with reference to FIGS. 7 and 8. FIGS. 7A to 7F and FIGS. 8A to 8F are views sequentially and schematically showing states of the placement base 1 from which the IC chips C have been removed. FIGS. 7 and 8 are partial enlarged views of a part ("G" in FIG. 1) of the large number of the IC chips C obtained by cutting the disc-shaped semiconductor wafer W into pieces by a laser or the like. It is to be noted that in FIGS. 7 and 8, chips having shapes that cannot be used as IC chips have been removed. In FIGS. 7 and 8, a hatched portion H represents the IC chips C to be removed next, a dashed portion F represents a portion from which the IC chips C have already been removed, and the predetermined number (the number of IC chips which are usually (in a state in which a sufficient number of IC chips, which is greater than or equal to the predetermined number, exist in one column) removed at a time) is eight. It is to be noted that FIG. 7 contains views immediately after a start of the removal of the IC chips C from one semiconductor wafer W in the first transporting step, and FIG. 8 contains views immediately before an end of the removal of the IC chips C from the one semiconductor wafer W in the first transporting step.

Figure 7A:
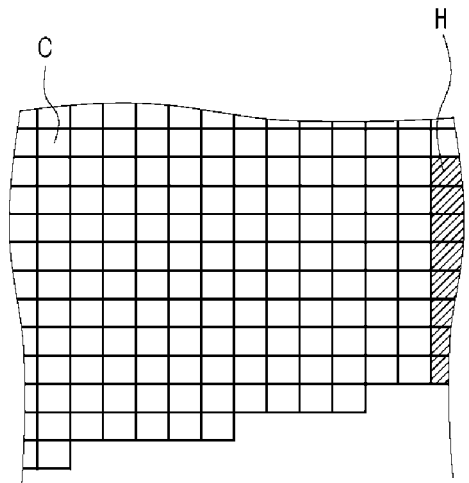
FIGS. 7A, 7B, 7C, 7D, 7E and 7F are schematic enlarged plan views of a main part of an electronic component mounting device, wherein the views sequentially and schematically illustrate states of a placement base from which electronic components have been removed.
Figure 7B:
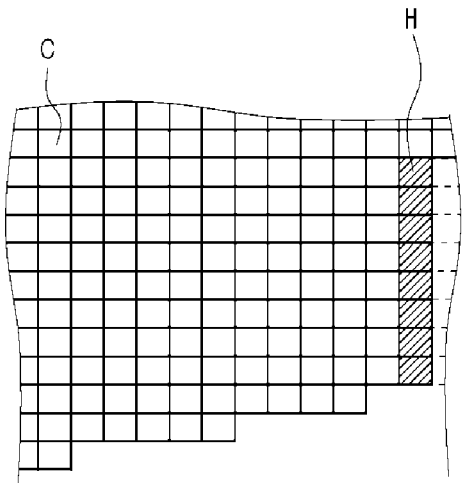
Figure 7C:
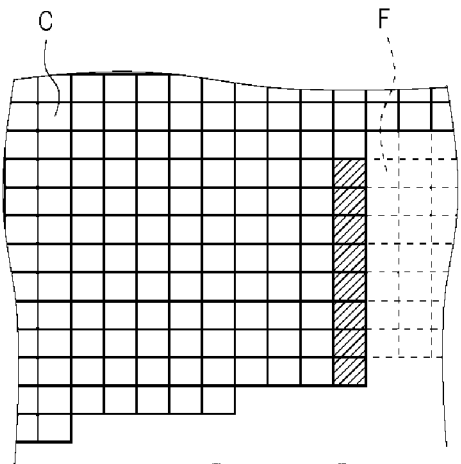
Figure 7D:
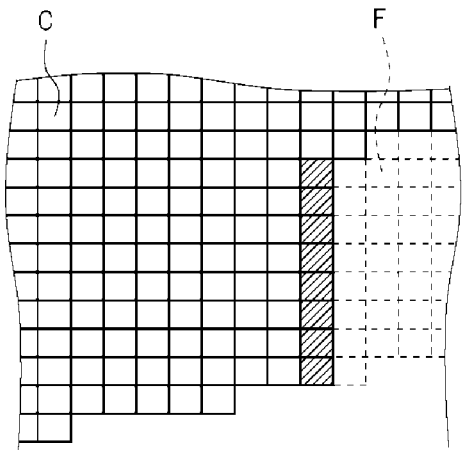
Figure 7E:
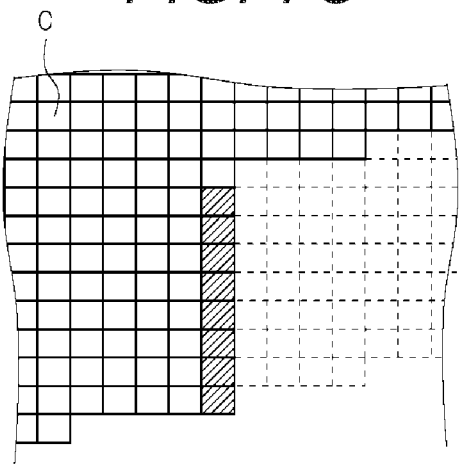
Figure 7F:
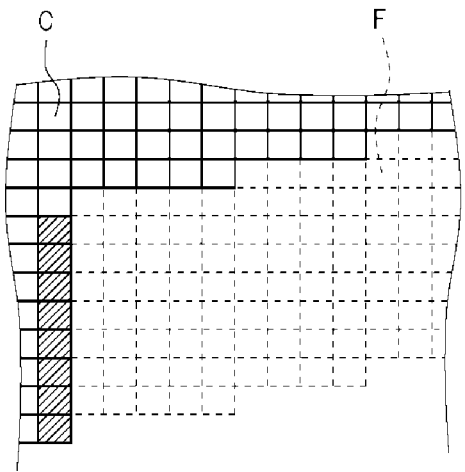

At a stage shown in FIG. 7A, eight IC chips C on a near side (a lower side in the drawing) in a rightmost column are removed. After that, as shown in FIG. 7B, eight IC chips C in a column adjacent to the rightmost column are removed. In this case, since the semiconductor wafer W is formed in a thin disc shape, not all the columns have an identical number of rows. Therefore, as shown in FIG. 7C, the IC chip C needs to be removed starting from a row that differs from those of the columns from which the IC chips C have been previously removed. Then, as shown in FIGS. 7D to 7F, the IC chips C are sequentially removed in the first transporting step. It is to be noted that, in FIGS. 7A to 7F, the number of IC chips C to be removed is identical.

Figure 8A:
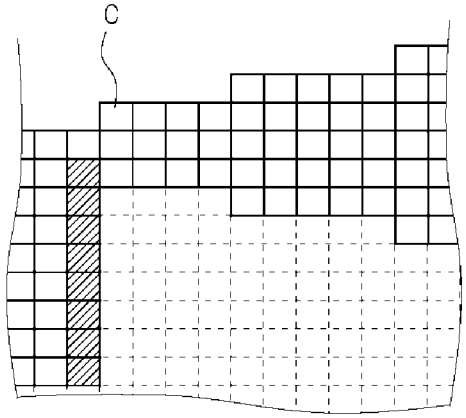
FIGS. 8A, 8B, 8C, 8D, 8E and 8F are schematic enlarged plan views of a main part of an electronic component mounting device, wherein the views sequentially and schematically illustrate states of a placement base from which electronic components have been removed.
Figure 8B:
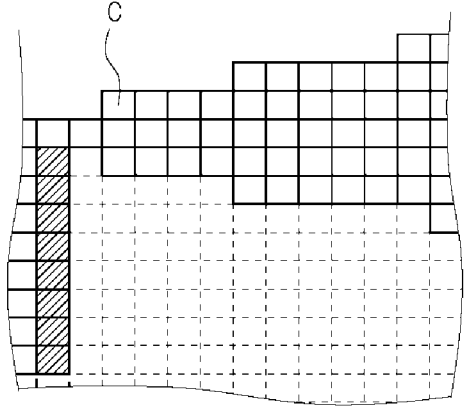
Figure 8C:
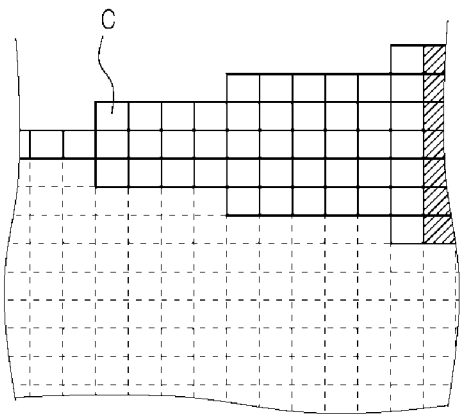
Figure 8D:
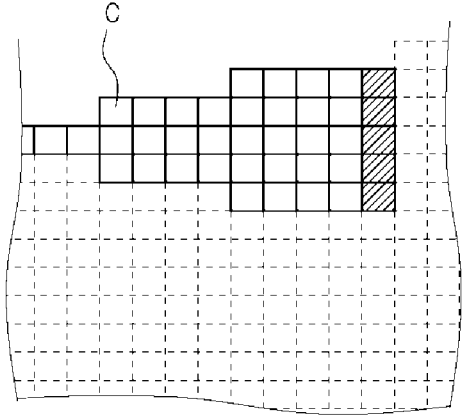
Figure 8E:
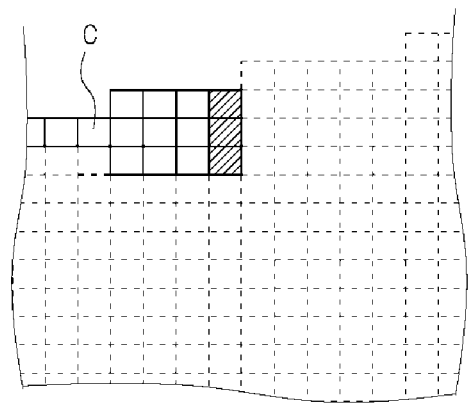
Figure 8F:
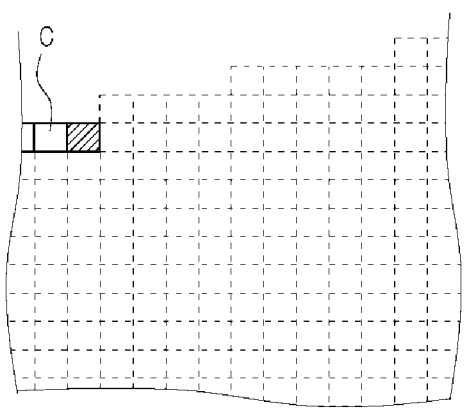

Furthermore, in each of FIGS. 8A and 8B, since the number of IC chips C in a column from which the IC chips C are to be removed is greater than or equal to the predetermined number (eight), eight IC chips C are to be removed. However, in each of FIGS. 8C to 8F, less than eight IC chips C are left in a column to be subjected to the removal; therefore, the IC chips C remaining in the column, the number of which is fewer than the predetermined number (for example, seven in FIG. 8C), are to be removed.

When the IC chips C, the number of which is fewer than the predetermined number (in this embodiment, less than eight), are thus sucked by a method similar to that for sucking eight IC chips C, a gas may flow into the negative pressure chamber 35 through the suction port 38 which does not suck the IC chip C, a sufficient negative pressure may fail to be generated, and a suction force of the suction ports 38 for the IC chips C may be degraded, failing to hold the IC chips C. Therefore, at stages shown in FIG. 8C to 8F, the displacement body 42 of the sucking and holding device 33 is moved relative to the suction tool 34 so that only the suction ports 38 which are to perform suction can communicate with the negative pressure chamber 35, whereby a sufficient suction force can be ensured.

Second Transporting Step

The second transporting step includes a step in which the removal unit 60 removes a plurality (in this embodiment, six) of the IC chips C in one row from the alignment portion 10, a step in which the inversion unit 90 inverts the IC chips C having been removed by the removal unit 60, a step in which the IC chips C having been inverted by the inversion unit 90 are placed in the temporary storage portion 70, and a step in which the reception and transport mechanism 75 and the mounting and transfer mechanism 80 transfer the eight IC chips C in the one row, which have been placed in the temporary storage portion 70, to the RFID tags A and place the IC chips C on the RFID tags A.

Furthermore, in the example shown in FIG. 1, four RFID tags A are also formed on the antenna sheet S in a short direction of the sheet (the Y direction in FIG. 1); therefore, the step in which the mounting and transfer mechanism 80 places the IC chips C on the antennas of the RFID tags A is performed four times, and then the sheet transport mechanism 2 transports the antenna sheet S. In short, the sheet transport mechanism 2 intermittently transports the RFID tags A.

Advantages

In the electronic component mounting device 100, the first transfer mechanism 30 removes a plurality (in this embodiment, eight) of the IC chips C from the placement base 1 by simultaneously sucking the IC chips C, the second transfer mechanism 50 removes a plurality (in this embodiment, six) of the IC chips C in one row from the placement table 10 by simultaneously sucking the IC chips C arranged with intervals between the columns, and the six IC chips C in the one row are simultaneously placed on the RFID tags A. In the electronic component mounting device 100, the plurality of the IC chips C can be simultaneously placed on the RFID tags A in this manner, whereby the IC chips C can be efficiently mounted.

Furthermore, in the electronic component mounting device 100, the electronic components (the IC chips C) are not directly mounted on attachments, but the electronic components (the IC chips C) are placed on the placement table 10 before being mounted on the attachments (the RFID tags A). In this case, the IC chips C are placed on the placement table 10 in consideration of placement positions, an alignment, and the like of the IC chips C so that the plurality of the IC chips C can be simultaneously mounted on the RFID tags A, whereby the IC chips C can be efficiently placed on the RFID tags A. In this embodiment, columns of the IC chips C are placed at intervals that are equal to intervals between attachment positions, whereby the IC chips C can be mounted more efficiently than a case of mounting the IC chips C on the RFID tags A by pick-and-place. The term "efficiently" as referred to herein means that the number of electronic components mounted in a given period of time is large. In the present invention, the electronic components are arranged at least in a row direction or a column direction; however, the electronic components, which have been arranged, do not necessarily need to be placed in close contact with one another.

In this embodiment, even in a case in which intervals between attachment positions of the attachments are changed owing to a change or the like in kind of attachment, the electronic component mounting device 100 can be configured in response to the change by changing only intervals (corresponding to the intervals D1 and D2 in FIG. 1) between the columns of the electronic components to be placed on the placement table 10. Moreover, since the temporary storage portion 70 includes the correction unit which corrects the positions of the electronic components placed in the temporary storage portion 70, the electronic components to be mounted on the attachments can be placed in the temporary storage portion 70 at more accurate positions than those on the placement table 10.

Furthermore, since the second transfer mechanism 50 includes the temporary storage portion 70 between the placement table 10 and the RFID tags A, a timing at which the removal unit 60 receives the IC chips C from the placement table 10, a timing at which the removal unit 60 delivers the IC chips C to the temporary storage portion 70, a timing at which the mounting and transfer mechanism 80 receives the IC chips C from the temporary storage portion 70, and a timing at which the mounting and transfer mechanism 80 places the IC chips C on the RFID tags A can be adjusted, whereby the IC chips C can be more efficiently mounted.

Since the placement table 10 moves between the first delivery position P1 at which the IC chips C are delivered from the first transfer mechanism 30, and the second delivery position P2 at which the IC chips C are delivered to the second transfer mechanism 50, the degree of freedom in designing positions at which components of the first transfer mechanism 30 and components of the second transfer mechanism 50 are provided is increased.

In addition, since the sucking and holding device 33 is configured to be able to change the number of IC chips C to be sucked, the number of IC chips C to be sucked by the first transfer mechanism 30 from the placement base 1 can be changed. Thus, even in a case in which the number of IC chips C remaining on the placement base 1 has decreased, the IC chips C remaining can be appropriately sucked.

In particular, the number of communication states to be established between the plurality of the suction ports 38 and the degassing port 36 is changed in accordance with an angular position (orientation) of the displacement body 42 with respect to the suction tool 34; among the plurality of the suction ports 38, the suction ports 38 which have communicated with the degassing port 36 can exert a suction force, while the other suction ports 38 do not communicate with the degassing port 36. Therefore, by changing the angular position (the orientation) of the displacement body 42 with respect to the suction tool 34, only desired suction ports 38 can suck objects, and a decrease in negative pressure due to a gas flowing through the other suction ports 38 can be avoided. Thus, the desired suction ports 38 can suitably suck objects. In this manner, the suction ports 38 to be used can be selected simply by rotational movement of the displacement body 42; consequently, the number of components is small and size reduction is achieved, as compared with a structure in which each of the suction ports 38 is provided with an opening/closing mechanism.

Other Embodiments

The present invention is not limited to the structure of the above embodiment, and the design can be appropriately modified within the scope intended by the present invention.

That is to say, in the above embodiment, the placement table 10 moves between the first delivery position P1 and the second delivery position P2; however, the present invention is not limited thereto, and the placement table 10 may be configured so as not to move horizontally.

Furthermore, even in a case in which the placement table 10 is provided to move between the first delivery position P1 and the second delivery position P2, the movement of the placement table 10 is not limited to slide movement as in the above embodiment, and the placement table 10 may rotationally move. Specifically, a structure may be employed in which the placement table has such a size that a part thereof is located at the first delivery position P1 and the other part thereof is located at the second delivery position P2, and the placement table is rotated around an axis which is at an intermediate position between the first delivery position P1 and the second delivery position P2 and extends in a vertical direction (the direction orthogonal to the paper surface of FIG. 1); after the electronic components are placed and aligned at the first delivery position P1, the placement table may be rotated so that the electronic components are located at the second delivery position P2. In addition, a conveyor belt may be used instead of the table as the alignment portion 10. Specifically, the conveyor belt extends at least from the first delivery position P1 to the second delivery position P2, and when the electronic components are placed on the conveyor belt at the first delivery position P1, the conveyor belt is circulated to transport the electronic components to the second delivery position P2. At this time, a portion of the belt on which the electronic components have not been placed is located at the first delivery position P1, and electronic components which are to be mounted after the electronic components positioned at the second delivery position P2 are placed on that portion. Then, when the electronic components at the second delivery position P2 have finished being mounted on the attachments, the conveyor belt is circulated to move the electronic components at the first delivery position P1 from the first delivery position P1 to the second delivery position P2. Such an operation is repeated, whereby the electronic components are mounted on the attachments. In a structure in which a plurality of placement tables are thus provided, an arrangement pattern of the electronic components at one of the placement tables may be different from an arrangement pattern of the electronic components at another placement table.

In the above embodiment, the mechanism in which the IC chips C are temporarily placed on the placement table 10 was described; however, the present invention is not limited thereto, and a state similar to that in which columns of the electronic components are arranged on the placement table 10 may be formed by arranging a plurality of the IC chips C in columns on a guide, base, rail, and/or the like (hereinafter, "guide or the like") which enables moving the IC chips C in units of columns, and moving the guide or the like so as to correspond to the intervals between the mounting positions of the attachments. In the present invention, it is preferable that a state in which the electronic components are arranged at high density is changed to a state in which columns of the electronic components are arranged at intervals corresponding to the intervals between the mounting positions of the attachments, and that after this, the electronic components are mounted in predetermined rows without changing the intervals between the electronic components.

In addition, the second transfer mechanism 50 is not limited to that including the removal unit 60, the temporary storage portion 70, the inversion unit 90, and the mounting and transfer mechanism 80. Furthermore, even in a case in which the second transfer mechanism 50 includes the removal unit 60, the temporary storage portion 70, and the mounting and transfer mechanism 80, the second transfer mechanism 50 is not limited to that including the inversion unit 90. It is to be noted that front and rear sides of some IC chips C may be differentiated (for example, a circuit may be formed on only one side); even in such a case, since the second transfer mechanism 50 includes the inversion unit 90, the IC chips C can be placed on the antenna A with desired surfaces of the IC chips C facing the antenna A.

In the electronic component mounting device 100 according to the above embodiment, the transfer mechanism includes the alignment portion 10, the first transfer mechanism 30, and the second transfer mechanism 50; however, the present invention is not limited thereto. For example, the transfer mechanism may simultaneously hold a large number of electronic components on the placement base, move the electronic components to adjust intervals therebetween while moving to the attachments, thereby aligning the intervals between the electronic components with intervals between the attachments, and then mount the electronic components on their respective attachments. Specifically, referring to FIG. 14, a transfer mechanism 110 includes: a plurality of suction devices 101; a movement mechanism 102 for simultaneously moving the plurality of the suction devices 101; an interval adjusting mechanism 103 for moving the suction devices 101 so that intervals between the suction devices are, respectively, a predetermined distance; and a vertical movement mechanism (not shown) for simultaneously vertically moving the plurality of the suction devices 101. It is to be noted that, in FIG. 14, a downward direction corresponds to a right side on the paper surface, and an upward direction corresponds to a left side on the paper surface.

In the above embodiment, the structure is employed in which the columns of the plurality of the IC chips C are each arranged on the placement table 10 at the different intervals D1 and D2 that correspond to the intervals between the mounting positions of the RFID tags A; however, the present invention is not limited thereto, and the IC chips C only need to be placed on the placement table 10 more efficiently than in a case of mounting by pick-and-place. The IC chips C do not necessarily need to be placed in columns; the electronic components may be placed by any method as long as a change in attachment or a change in interval between attachment positions can be easily responded to and the electronic components can be efficiently mounted. An electronic device may be manufactured in such a manner that a plurality of electronic components having been arranged at high density are placed on an alignment portion at intervals at least in a row direction or a column direction to be arranged at lower density than that before being removed, and the plurality of the electronic components are simultaneously held, transported, and mounted on a plurality of attachments. In the above embodiment, the electronic components arranged in one row are simultaneously mounted on the attachments; however, the electronic components may be removed column by column and mounted on the plurality of the attachments arranged in the column direction.

Furthermore, the first transfer mechanism 30 and/or the second transfer mechanism 50 preferably transport(s) the plurality of the electronic components without changing the intervals therebetween. A structure in which the intervals between the electronic components being held are changed has large limitations in space and structure because wirings or suction tubes are arranged in a complicated manner. A structure is employed in which the first transfer mechanism 30 places the electronic components (the IC chips C) on the alignment portion 10 so that the second transfer mechanism 50 can simultaneously mount the plurality of the electronic components on the plurality of the attachments without changing the intervals between the electronic components; thus, the intervals between the electronic components do not need to be changed while the first transfer mechanism 30 and the second transfer mechanism 50 transfer the electronic components. Accordingly, the structure is simplified, and the wirings and the suction tubes become unnecessary, enabling a reduction in cost.

The suction devices 101 each include a suction cylinder 101a, one end (in this embodiment, a lower end) of which can suck and hold an object (the IC chips C) such as an electronic component or the like. The other end (in this embodiment, an upper end) of the suction cylinder 101a is supported by a guide 101b. Lower ends of the suction devices 101 are each positioned at the same height. A lower portion of each of the suction devices 101 is connected to a suction tube (not shown), thereby sucking an object at the lower end thereof. The movement mechanism 102 simultaneously moves the plurality of the suction devices 101. The movement mechanism 102 simultaneously moves all the suction devices 101 in a direction orthogonal to the paper surface of FIGS. 14A and 14B.

The interval adjusting mechanism 103 adjusts the interval between the respective suction devices 101. The interval adjusting mechanism 103 includes separation mechanisms 103a for moving the suction devices 101 at both ends of the array of the suction devices 101 so that the suction devices 101 at the both ends are separated from each other, pins 103c provided for the respective suction devices, and regulation plates 103b which regulate a relative movement range of the respective suction devices. The separation mechanisms 103a move the suction devices 101 at the both ends of the array of the suction devices 101 in a direction in which the suction devices 101 at the both ends are separated from each other, and a direction in which the suction devices 101 at the both ends approach each other. The regulation plates 103b are fixed to the suction devices 101 by the pins 103c. Furthermore, each of the regulation plates 103b is provided with a long hole, and the pin 103c of the suction device 101 adjacent to the suction device 101 in which the regulation plate 103b is fixed by the pin 103c is arranged in the long hole. The long hole determines the relative movement range of the suction device 101 with respect to the suction device 101 adjacent thereto. The interval adjusting mechanism 103 is not limited thereto and only needs to be configured to move the electronic components to adjust the intervals between the electronic components so that the intervals between the electronic components are aligned with intervals between mounting positions of the attachments.

After the intervals between the suction devices 101 adjacent to one another are adjusted to be, respectively, a predetermined interval, the vertical movement mechanism vertically moves all the suction devices 101 to mount the electronic components to the attachments.

The structure of this embodiment is not limited thereto, and another structure may be added. For example, a position determination mechanism for accurately aligning the positions of the electronic components with the mounting positions of the attachments, or the like may be provided.

Figure 14A:
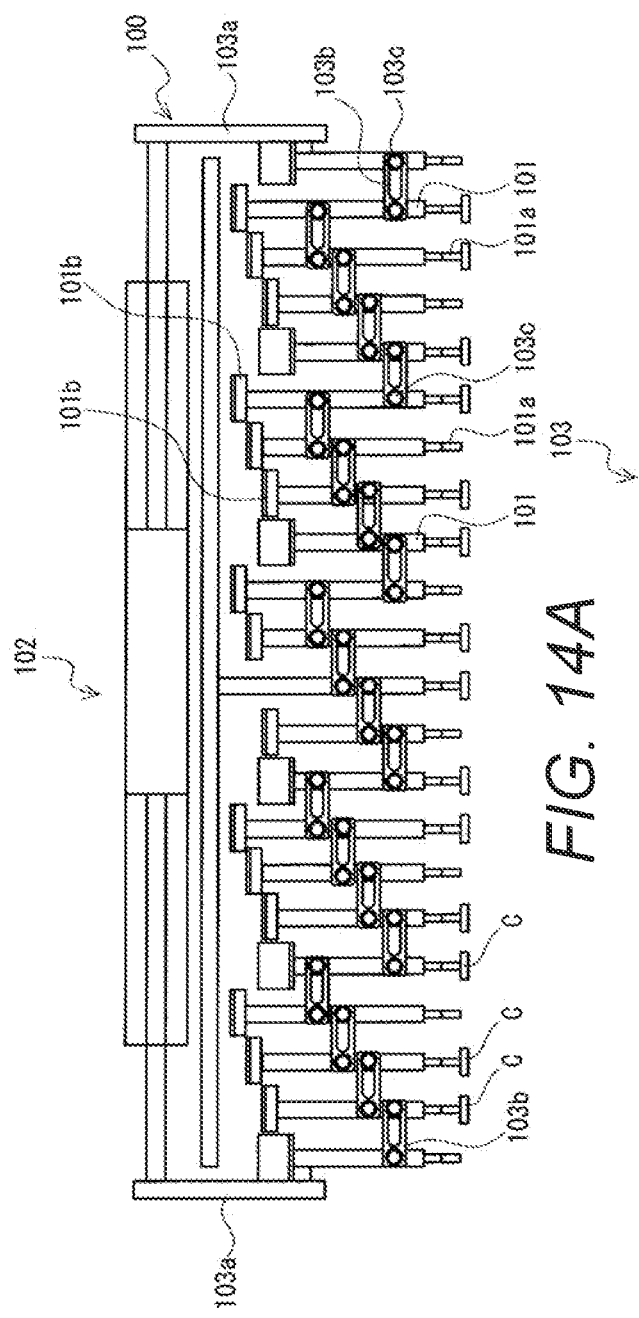
Figure 14B:
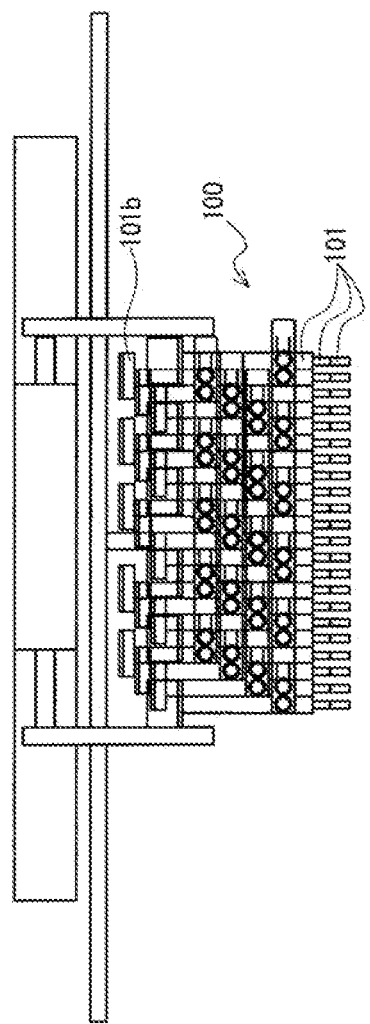

When the electronic components are mounted on an electronic device, the plurality of the suction devices 101 remove a plurality of electronic components from the placement base by simultaneously sucking and holding the electronic components (removes the electronic components in a state in FIG. 14B), and the intervals between the electronic components adjacent to one another are adjusted by the interval adjusting mechanism 103 to accord with the intervals between the mounting positions of the respective attachments (a state shown in FIG. 14A). Then, when the suction devices 101 move to positions above the respective attachments, the suction devices 101 are moved downward by the vertical movement mechanism and place the electronic components at the mounting positions of the attachments.

In this structure, the alignment portion or the like does not need to be arranged, as compared with the structure of the above embodiment; therefore, the structure can be simplified, enabling a reduction in cost.

In the above embodiment, the second transfer mechanism 50 simultaneously sucks the IC chips C in one row from the placement table 10; however, the second transfer mechanism may simultaneously suck IC chips C in a plurality of rows from the placement table. Thus, the electronic components are more efficiently removed from the alignment portion by the second transfer mechanism. For example, the removal mechanism may simultaneously suck a plurality of electronic components in two rows (for example, in a structure in which eight electronic components are arranged in one row as in the above embodiment, 8 by 2 (rows), i.e., sixteen electronic components), and the plurality of the electronic components in the two rows may be delivered to the inversion unit or the temporary storage portion.

Furthermore, in the above embodiment, the second transfer mechanism 50 and the mounting and transfer mechanism 80 simultaneously place the IC chips C in one row on the RFID tags A; however, the second transfer mechanism may simultaneously place electronic components, such as the IC chips C or the like, in a plurality of rows on attachments, such as the RFID tags A or the like. Thus, the electronic components are still more efficiently mounted by the second transfer mechanism. For example, the mounting and transfer mechanism may simultaneously receive a plurality of electronic components in two rows (for example, in a structure in which eight electronic components are arranged in one row as in the above embodiment, 8 by 2 (rows), i.e., sixteen electronic components) from the temporary storage portion, and the plurality of the electronic components in the two rows may be placed on the attachments.

The feature in which the sucking and holding device is configured to be able to change the number of electronic components to be sucked is not an essential constituent feature of the present invention; furthermore, even in a case in which the sucking and holding device is configured to be able to change the number of electronic components to be sucked, the present invention is not limited to the structure in the above embodiment.

Figure 9:
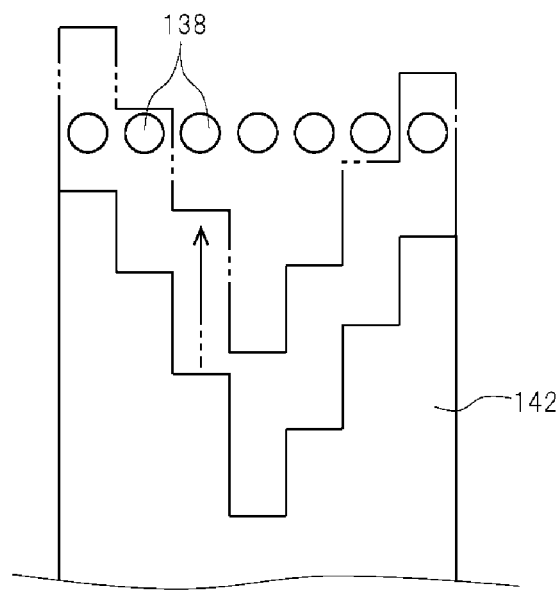
FIG. 9 is a schematic plan view showing an internal structure of a housing of a sucking and holding device according to another embodiment of the present invention.

Specifically, in the above embodiment, the displacement body is a cylinder; however, the displacement body may be a plate which slides while being in contact with the inner wall of the negative pressure chamber. For example, as shown in FIG. 9, a structure may be employed in which the displacement body is constituted by a plate 142 having a stepped external shape. In this structure, the sucking and holding device does not include the displacement body 42 present in the above embodiment, but includes a suction tool having a structure similar to that of the suction tool in the above embodiment and the plate 142 arranged on a bottom face of the suction tool. FIG. 9 is a view of the bottom face side of the suction tool, wherein the bottom face side is observed from an inside of a negative pressure chamber of the suction tool. A structure is also possible in which the plate 142 slides while being in contact with the inner wall (the bottom face) of the negative pressure chamber, whereby desired suction ports 138 provided on the bottom face of the negative pressure chamber communicate with the negative pressure chamber, and the other suction ports 138 are closed by the plate 142, whereby communication with the negative pressure chamber is shut.

Figure 10:
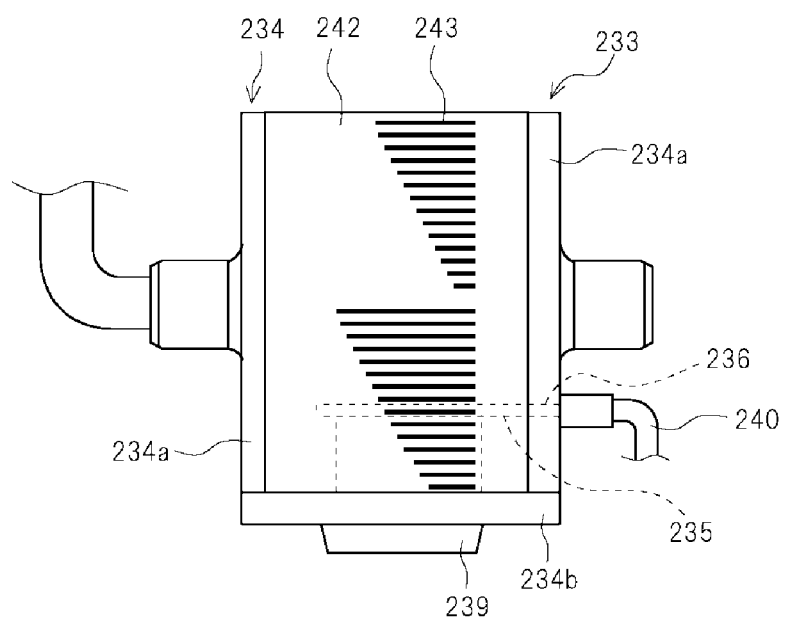
FIG. 10 is a schematic side view of a sucking and holding device according to another embodiment of the present invention.
Figure 11:
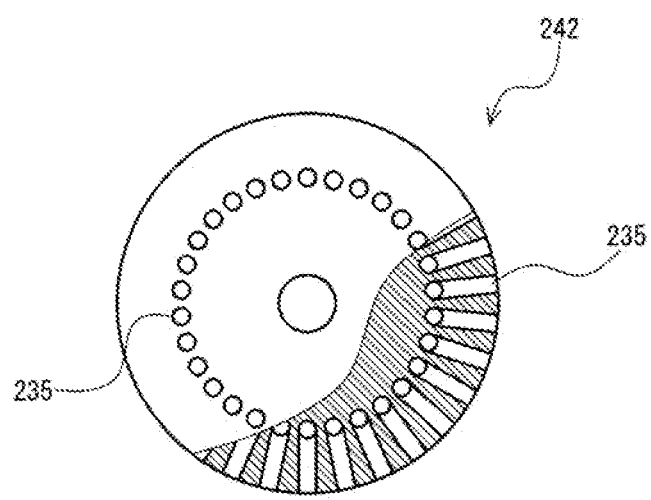
FIG. 11 is a schematic front view of a rotating body used for a sucking and holding device according to another embodiment of the present invention.

Furthermore, the structure provided with the negative pressure chamber has been described in the above embodiment; however, a structure may also be employed in which a plurality of communication paths are formed in a moving object and a predetermined communication path communicates with the degassing port depending on a relative position of the moving object, whereby the degassing port communicates with a desired suction port. Specifically, a structure as shown in FIGS. 10 and 11 can be employed. A sucking and holding device 233 in FIGS. 10 and 11 includes a suction tool 234 which includes a collet portion 239 provided with a plurality of suction ports (not shown). The plurality of suction ports are provided to penetrate the collet portion 239 in a vertical direction (a vertical direction in FIG. 10). Furthermore, a displacement body for selectively changing a communication state between the suction port and the degassing port 236 depending on a position relative to the suction tool 234 is constituted by a rotating body 242 capable of rotating with respect to the collet portion 239. The rotating body 242 includes a plurality of communication holes 235 which can communicate with the degassing port 236 at a predetermined rotational angle and are formed along a rotational axis direction, and a plurality of long holes 243 which are formed from an outer face of the rotating body 242 to the respective communication holes 235, are each parallel to the rotational axis, and have different lengths.

More specifically, as shown in FIG. 10, the suction tool 234 of the sucking and holding device 233 includes a pair of support portions 234a which support both sides of the rotating body 242, which has a columnar shape, making the rotating body 242 rotatable; and a connection portion 234b which connects the pair of support portions 234a, wherein the connection portion 234b is provided with the collet portion 239. Furthermore, the degassing port 236 is formed in one of the support portions 234a, and the degassing port 236 is connected to a suction hose 240. Thus, the communication hole 235 communicating with the degassing port 236 is changed by relative rotation of the rotating body 243, and negative pressure is generated in the long hole 243 which communicates with the communication hole 235, which in turn communicates with the degassing port 236, whereby suction can be performed through, of a plurality of suction ports of the collet portion 239, a suction port communicating with the long hole 243, in which the negative pressure has been generated.

Figure 12:
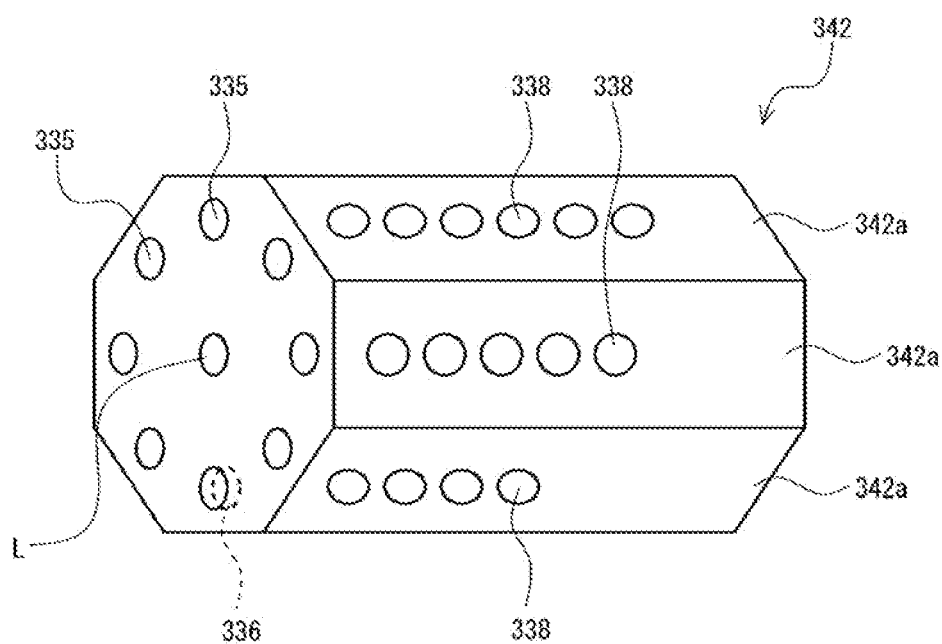
FIG. 12 is a schematic perspective view of a rotating body according to another embodiment of the present invention.

In addition, even in a case in which the moving object is constituted by the rotating body, the shape of the rotating body is not limited to a cylindrical shape or a columnar shape; for example, as shown in FIG. 12, the shape may be a columnar shape having a polygonal cross section. A rotating body 342 shown in FIG. 12, which serves as the moving object, is provided in a polygonal columnar shape, and a plurality of communication holes 335 which can communicate with a degassing port 336 at a predetermined rotational angle and are formed along a rotational axis direction are formed in the rotating body 342. Furthermore, one or a plurality of suction ports 338 are formed on each side surface 342a of the rotating body 342, and the suction ports 338 on one side surface 342a communicate with one communication hole 335. The number of suction ports 338 varies between the side surfaces 342a, thereby enabling responding to a change in the number of electronic products to be sucked. It is to be noted that, in the drawing, sizes are exaggerated for ease of understanding. The size of the communication hole 335 differs depending on an electronic component; in a case of holding an IC chip, an extremely small hole is preferred. Furthermore, the width of each side surface 342a is also exaggerated in FIG. 12.

In addition, in the above embodiment, the sucking and holding device 33 sucks the electronic components in only one column; however, the sucking and holding device may be able to suck the electronic components in a plurality of columns. Furthermore, in the above embodiment, in one first transporting step, in which the electronic components are transferred from the placement base 1 to the alignment portion 10 and placed thereon, the sucking and holding device 33 sucks the electronic components C in only one column; however, the present invention is not limited thereto, and the electronic components in a plurality of columns may also be sucked and transported in one first transporting step. In this case, the electronic components are preferably placed on the alignment portion to be arranged column by column with intervals between the columns.

Figure 13:
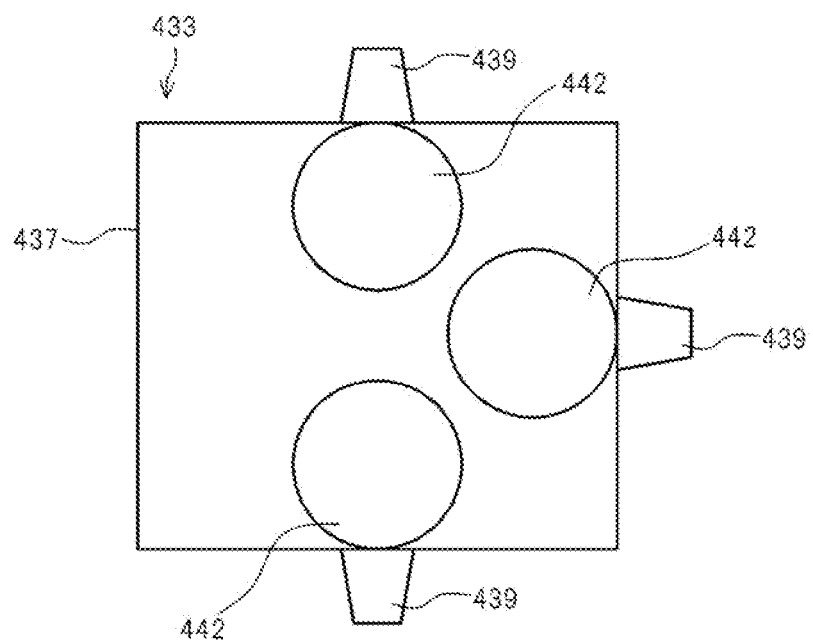
FIG. 13 is a schematic front view of a sucking and holding device according to another embodiment of the present invention.

Specifically, as shown in FIG. 13, a structure may also be employed in which a sucking and holding device 433 includes a plurality of rotating bodies 442 and a plurality of collet portions 439. Each of the rotating bodies 442 and each of the collet portions 439 have structures similar to those of the moving object 42 and the collet portion 39, respectively, in the above embodiment; therefore, detailed description thereof will be omitted. Although FIG. 13 is a schematic view, three rotating bodies 442 are incorporated in a negative pressure chamber (not shown) in a housing 437, and three side surfaces of the housing 437 are provided with the collet portions 439 in which a plurality of suction ports (not shown) are formed. Furthermore, the housing 437 is rotatable around a rotational axis extending in a direction orthogonal to the paper surface of FIG. 13. Rotation of the housing 437 enables electronic products to be sucked by only the suction ports of the collet portions 439 that are selected. The number of electronic components to be sucked is changed by rotation of the rotating body 442. When the products are delivered to the alignment portion, the housing 437 rotates so that each side surface thereof faces downward, whereby the electronic components being sucked by each of the collet portions 439 can be delivered to the alignment portion.

In the above embodiment, the sucking and holding device 33, which picks up and removes the electronic components by sucking the electronic components by way of a negative pressure, has been employed as the removal mechanism for removing the electronic components; however, the present invention is not limited thereto, and any structure may be employed as long as, from a placement base on which an electronic component group including a plurality of electronic components is placed, the plurality of the electronic components included in the electronic component group are separated and removed from the electronic component group on the placement base. For example, a structure in which a conveyor or the like removes electronic components column by column from a group of electronic components arranged in a plurality of rows and a plurality of columns, a structure in which electronic components are moved and removed using a blade or the like, or the like may be employed.

In the above embodiment, the transfer direction of the first transfer mechanism 30 is substantially orthogonal to a transfer direction of the second transfer mechanism 50; however, the present invention is not limited thereto, and depending on an environment in which the device is to be installed, the transfer directions may be identical or may cross each other in a manner not being orthogonal.

Furthermore, in the above embodiment, one alignment portion 10, one first transfer mechanism 30, and one second transfer mechanism 50 are provided; however, the number of alignment portions, the number of first transfer mechanisms, and the number of second transfer mechanisms are not limited thereto. In other words, a plurality of placement bases or a plurality of first transfer mechanisms may be provided for one alignment portion, or a plurality of alignment portions may be provided for one placement base.

In addition, the example in which the IC chips serving as the electronic components are mounted on the antennas of the RFID tags serving as the attachments has been described in the above embodiment; besides, the electronic component mounting device according to the present invention can be used for mounting or assembling a variety of electronic components, for example, for mounting an IC chip on an RFID strap including an IC chip and an expanded electrode, for mounting an RFID strap on an RFID tag, for mounting an electronic component on an IoT substrate, for mounting an electronic component on a sensor substrate, and for mounting an LED on an electronic device.

In the above embodiment, a defect of the IC chip C is not considered; however, in an aspect of the present invention, adding a structure for detecting and removing a defective electronic component in a case in which a defective electronic component is included is also conceivable.

More specifically, the following operation is performed. While the electronic components are transported from the placement base to the placement table for temporary storage, a test is performed to determine whether each electronic component is a non-defective electronic component. For example, in a case in which the electronic component is a printed electronic product such as an IC chip, an LED substrate, an IoT substrate, or the like, the presence or absence of an appearance defect is determined based on an image captured by a camera, and the presence or absence of a functional defect is determined by energization.

Defective electronic components are thus detected, and only non-defective electronic components are arranged on the placement table without placing the defective electronic components thereon. Since only the non-defective electronic components are arranged on the placement table, as compared with a case in which the defective electronic components are removed after the electronic components are mounted on products, members on which the electronic components are to be mounted are not wasted, reducing loss.

It is to be noted that detection of the defective electronic components and removal of the defective electronic components may be performed at any time; however, the detection and removal are particularly preferably performed in an upstream process, reducing loss of other components.

In the above embodiment, the structure has been described in which the IC chips obtained by cutting the semiconductor wafer into pieces are mounted on the RFID tags; however, a structure may also be employed in which detection of defective electronic components is performed after the semiconductor wafer is cut, and then, only non-defective electronic components placed on a portion are mounted on the RFID tags.

The electronic component may be, besides the IC chip, a printed electronics product or the like, such as an LED substrate or an IoT substrate.

In addition, in the above embodiment, the case has been described in which the IC chips are placed on the placement base to be arranged in rows and columns in close contact with one another; however, the present invention is not limited thereto. A plurality of electronic components may be placed on the placement base without being aligned or may be placed thereon at random in a plurality of columns.

In the above embodiment, the placement base 1 and the alignment portion 10 are separate bases; however, these bases may be integrated.

Furthermore, in the above embodiment, the electronic components are aligned on the placement base in close contact with one another without gaps therebetween; however, the electronic component mounting device according to the present invention can also be effectively applied to electronic components arranged on the placement base with gaps therebetween. In other words, according to the present invention, the electronic components having been aligned on the placement base in close contact with one another are arranged on the alignment portion with intervals between columns by the first transfer mechanism, whereby, subsequently, a plurality of the electronic components in one row can be simultaneously mounted on the attachments; the present invention can be effectively applied to a case in which the intervals between the electronic components which have been aligned on the placement base are not identical to the intervals between the attachment positions, on which the plurality of the electronic components are to be mounted on the attachments.

Figure 15:
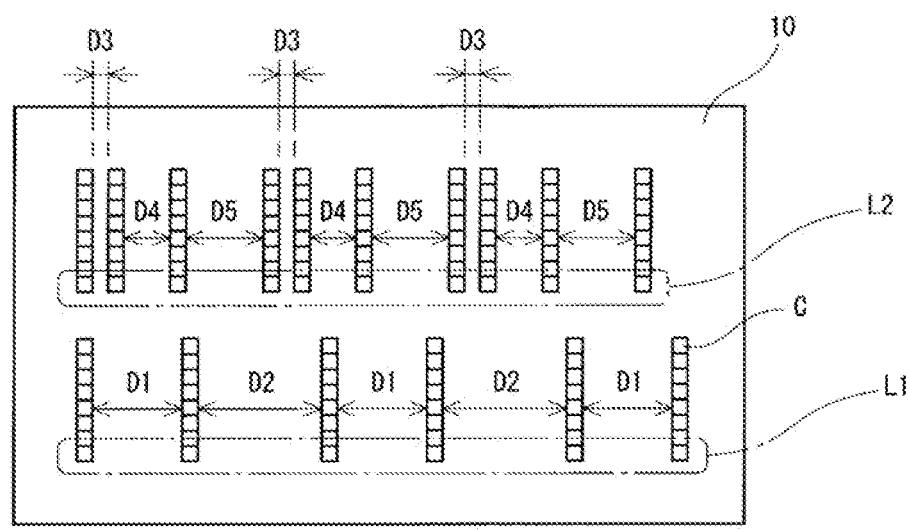
FIG. 15 is a schematic enlarged plan view schematically showing a main part of a placement base according to another embodiment of the present invention.

In the above embodiment, the electronic component mounting device is adapted to the attachments in which the intervals D1 and D2, each being a different interval between the attachment positions, are repeated in the row direction; however, as described in FIG. 15, the electronic component mounting device may also be adapted to attachments in which the three intervals D3, D4, and D5, each being a different interval between the attachment positions, are repeated in the row direction, or may be adapted to attachments in which the different intervals are not repeated in the row direction (attachments being in a pattern in which the intervals between the attachment positions are irregular, e.g., a case in which all intervals between the attachments are different).

In the above embodiment, the attachment positions being in the same pattern are arranged in all of the rows; however, the present invention may be adapted to attachments in which each row has a different interval pattern.

In the above embodiment, the antenna sheet having the RFID tags formed thereon was described as an example of the attachments; however, the kind of the attachment is not limited thereto, and the present invention may also be applied in a case in which the electronic components are simultaneously mounted on different attachments.

In the above embodiment, the electronic component mounting device having the one alignment portion was described; however, a configuration in which there are a plurality of alignment portions may also be adopted. Furthermore, in the case in which the electronic component mounting device has the plurality of the alignment portions, an alignment pattern may be different for each of the alignment portions. Specifically, for example, odd-numbered columns may be put into a first interval pattern, and even-numbered columns may be put into a second interval pattern (an interval pattern which differs from the first interval pattern).

In the above embodiment, the second transfer mechanism repeatedly transfers the electronic components in the same interval pattern; however, the second transfer mechanism may transfer the electronic components in different interval patterns. Specifically, the second transfer mechanism may repeat each of: a step of transferring the electronic components in a first interval pattern; and a step of transferring the electronic components in a second interval pattern. For example, in FIG. 15, the second transfer mechanism may repeat each of: a step of transferring the IC chips in an L1 row, and a step of transferring the IC chips in an L2 row. In other words, the transporting step(s) may include: a step of mounting the electronic components in a first interval pattern, and a step of mounting the electronic components in a second interval pattern which differs from the first interval pattern.

In the above embodiment, the second transfer mechanism transfers the electronic components in the one row when performing one transfer operation; however, the second transfer mechanism may have a structure in which a plurality of rows of the electronic components are transferred simultaneously. In this case, interval patterns in the plurality of rows of the electronic components may each be different. For example, in FIG. 15, the IC chips in the L1 row and the IC chips in the L2 row may be transported simultaneously.

Figure 16:
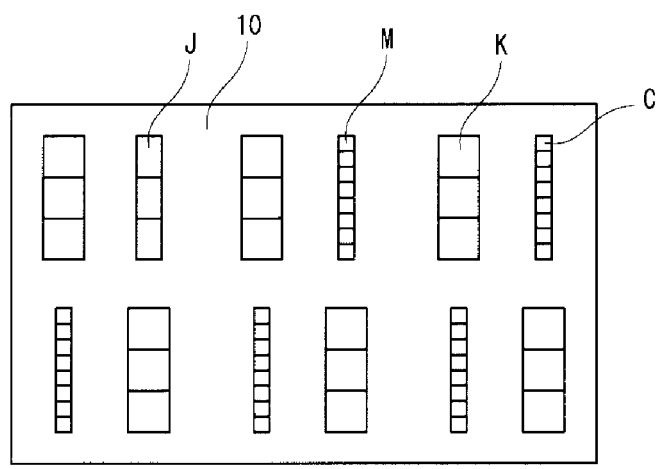
FIG. 16 is a schematic enlarged plan view schematically showing a main part of a placement base according to another embodiment of the present invention.

In the above embodiment, only the IC chips have been placed, but the present invention is not limited thereto. With regard to the present invention, as disclosed in FIG. 16, a plurality of electronic components J, K, and M, e.g., semiconductors and/or sensors, may be aligned and simultaneously transported. In this case, a plurality of types of the electronic components can be efficiently mounted.

In the above embodiment, each column of the electronic components was systematically arranged in the alignment portion; however, for example, the electronic components may be arranged in the alignment portion in a matrix, with different columns of the electronic components being removed with intervals in a row direction therebetween (for example, removing a first column, fourth column, and eighth column of the electronic components). An operation may also be conducted in which, as opposed to removing all of the columns of the electronic components, the electronic components being in positions corresponding to positions of the attachments are removed.

It is to be noted that in the above embodiment, a structure in which the positions of the attachments are verified has been adopted; however, the present invention is not limited thereto, and a structure which does not involve the structure of verifying the positions of the attachments may be adopted. Furthermore, the positions of the attachments may be verified by a mechanism which verifies the positions of the attachments, and the positions of the electronic components on the placement table may be adjusted. This placement adjustment may be conducted by the first transfer mechanism, or a separate placement adjustment mechanism may be provided.

As the installation target, as shown in FIG. 17, an electrode sheet having a pair of electrodes Sa and Sb formed thereon may be used. Each of the pair of electrodes Sa and Sb is formed having a predetermined width along a lengthwise direction. The pair of electrodes Sa and Sb are arranged and positioned in a width direction having therebetween a gap formed centrally in the width direction. The pair of the electrodes have the same width, but the widths may be different.

A strap-manufacturing device in FIG. 17 manufactures a strap to be used for an RFID tag or the like. In this case, the strap includes: the pair of the electrodes Sa and Sb arranged with the gap therebetween; and IC chips positioned to be in contact with the pair of electrodes Sa and Sb and on the gap between the pair of electrodes Sa and Sb. The strap-manufacturing device includes: an alignment case 10; a installation target transport mechanism (not shown (a mechanism having the same functionality as the sheet transport mechanism 2 in FIG. 1)); and an IC chip transport mechanism (not shown (a mechanism having the same functionality as the second transfer mechanism 50 and the mounting and transfer mechanism 80 in FIG. 1)).

A semiconductor wafer is cut with a laser or the like to form a plurality of the IC chips C, and the plurality of the IC chips C are arranged in the alignment case 10 in a plurality of columns with intervals therebetween. The alignment case 10 has columnar grooves 10A formed in an aligned manner, and the plurality of the IC chips C are positioned in the grooves 10A. When the IC chips C in the front of each of the columns in the grooves 10A in the alignment case are moved, each of the remaining columns of the IC chips C moves forward by just one IC chip C. The plurality of the IC chip columns may all be positioned having the same predetermined interval therebetween, or may be positioned with different intervals therebetween. There may be a case of positioning the plurality of the IC chip columns to accord with intervals between mounting targets, and/or there may be a case of positioning the plurality of the IC chip columns having predetermined intervals therebetween.

The installation target transport mechanism transports the installation targets and moves portions on which no IC chips have yet been installed to placement positions. When the IC chips C are placed, an installation item transport mechanism moves the portions on which the IC chips C have been placed from the placement positions.

Of the plurality of the IC chip columns aligned in the alignment case 10A, the IC chip transport mechanism transports the IC chips C in the front of each of the columns in units of rows to the gap between the pair of electrodes, and places them thereon. The IC chip transport mechanism transports the IC chips in the front of each of the columns while maintaining distance intervals therebetween.

Figure 17A:
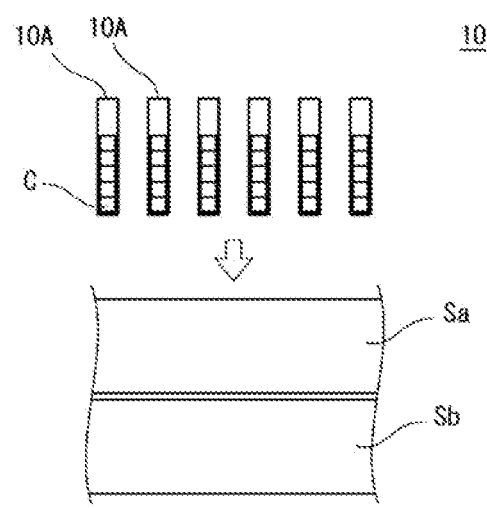
FIG. 17A is a schematic explanatory view showing a state before placing IC chips on an electrode sheet in a method of manufacturing a strap according to another embodiment of the present invention.
Figure 17B:
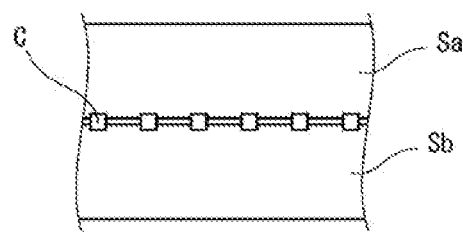
FIG. 17B is a schematic explanatory view showing a state in which IC chips have been placed on an electrode sheet in a method of manufacturing a strap according to another embodiment of the present invention.
Figure 17C:
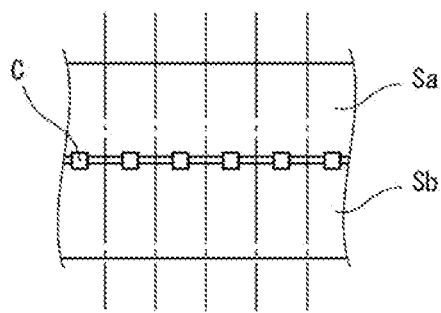
FIG. 17C is a schematic explanatory view showing a state of cutting an electrode sheet on which IC chips have been placed in a method of manufacturing a strap according to another embodiment of the present invention.
Figure 17D:
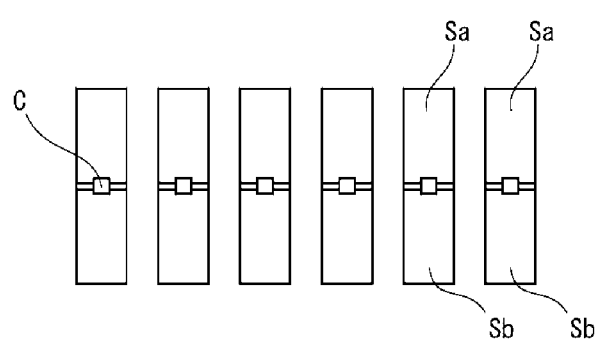
FIG. 17D is a schematic explanatory view showing a strap manufactured by a method of manufacturing a strap according to another embodiment of the present invention.

The method of manufacturing a strap by means of the device in FIG. 17 includes: a step of transporting an electrode sheet to a predetermined position, the electrode sheet having formed thereon a pair of electrodes spaced apart by a predetermined gap along a longitudinal direction; a step of arranging a plurality of the IC chips C in a plurality of columns with intervals therebetween as shown in FIG. 17A; and a step of transporting the plurality of the IC chips C to the predetermined position while holding the plurality of the IC chips C in the columns, and placing the IC chips C to be in contact with the pair of electrodes Sa and Sb, and positioned on the gap between the pair of electrodes Sa and Sb as shown in FIG. 17B.

It is to be noted that the strap-manufacturing device shown in FIG. 17 enables manufacturing a whole roll of the straps, in which the straps are joined in a row, by the arrangement case 10A, the installation target transport mechanism, and the IC chip transport mechanism; however, the strap-manufacturing device may be a device further including a cutting mechanism. In other words, the method of manufacturing a strap may further include, after the step of placing the IC chips, a step of cutting each strap as shown in FIG. 17C. The cutting mechanism performs a cutting operation between the continuous IC chips to produce each strap. For the cutting, other than using a blade, any measure, such as using a laser, performing half-cutting, or the like may be adopted, so long as the structure enables cutting at least a part of the installation target.

Furthermore, further providing the strap-manufacturing device with an applying device which applies an adhesive or the like on the straps is conceivable as well. In addition to the applying device, providing a release paper-supplying mechanism which attaches a release paper to a face having the adhesive applied thereon is conceivable as well.

It is to be noted that when the arrangement case 10 such as that described above is used, the intervals between the columns of the IC chips C are decided; thus, in a case of wishing to change the intervals between the columns of the IC chips C to different intervals, it is necessary to prepare a different arrangement case. In the device shown in FIG. 17, the intervals between the installation items such as the IC chips C can be changed by changing the arrangement case, thereby enabling easily supporting various kinds of installation targets with different installation intervals between the installation items.

Figure 18:
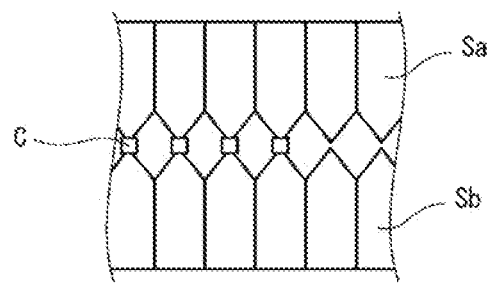
FIG. 18 is a schematic explanatory view showing a state in which IC chips have been placed on an electrode sheet in a method of manufacturing a strap according to another embodiment of the present invention.

As a structure of the strap shown in FIG. 17, the structure in which there is the gap along the lengthwise direction of the whole roll and the pair of electrodes 17a and 17b are respectively positioned on each side in the width direction of the gap has been adopted; however, as shown in FIG. 18, the structure may also be such that the pair of electrodes 17a and 17b are in a tapered shape toward the gap between the pair of electrodes. However, the gap between the pair of electrodes 17a and 17b being evenly provided, as in the strap shown in FIG. 17, is preferred, whereby mounting accuracy in the lengthwise direction of the whole roll is permitted to be low. To put it differently, it is only necessary for positions of the installation items to be installed with high accuracy in the width direction, whereby the mounting is easy. Thus, the strap can be efficiently manufactured.

As set forth above, the electronic component mounting device according to the present invention enables efficient, highly accurate mounting of electronic components on attachments; therefore, the electronic component mounting device according to the present invention can be suitably used to mount IC chips of a semiconductor wafer on antenna members, for example.

The invention claimed is:

1. An electronic component mounting device configured to mount, on attachments, a plurality of electronic components that have been placed at intervals in a predetermined portion such that the plurality of the electronic components are placed on the attachments at certain intervals that are different from each other and are different from the intervals in the predetermined portion, the electronic component mounting device comprising:
   a removal mechanism configured to remove some of the plurality of the electronic components that have been placed in the predetermined portion;
   a transport mechanism configured to transport the electronic components that have been removed by the removal mechanism, configured to move the electronic components such that, before reaching the attachments, the plurality of the electronic components are arranged at the certain intervals at which the plurality of the electronic components are to be mounted on the attachments, and configured to transport the electronic components to the attachments; and
   a mounting and transfer mechanism configured to mount the electronic components that have been transported by the transport mechanism on predetermined positions of the attachments, wherein
   the transport mechanism comprises:
      an alignment portion in which the electronic components are positioned, between the removal mechanism and the mounting and transfer mechanism, in a plurality of columns comprising the certain intervals therebetween;
      a first transfer mechanism configured to hold the electronic components removed by the removal mechanism and configured to move the electronic components that has been held to the alignment portion; and
      a second transfer mechanism configured to transfer the electronic components that have been moved to the alignment portion to the mounting and transfer mechanism,
   the first transfer mechanism comprises a sucking and holding device that is configured to change a number of electronic components to be sucked,
   the sucking and holding device comprises:
      a suction tool comprising a plurality of suction ports and a degassing port; and
      a displacement body which is displaced relative to the suction tool to allow the plurality of the suction ports and the degassing port to communicate with each other, and
   the displacement body is configured to selectively change a communication state between a part or all of the plurality of the suction ports and the degassing port, depending on a position relative to the suction tool.

2. The electronic component mounting device according to claim 1, wherein
   the first transfer mechanism moves the electronic components to the alignment portion and places the electronic components therein such that the electronic components are arranged in the plurality of columns comprising the certain intervals therebetween,
   the second transfer mechanism transports a plurality of the electronic components in one row from the alignment portion while keeping the certain intervals between the electronic components, and
   the mounting and transfer mechanism mounts the electronic components on the attachments with the certain intervals between the electronic components.

3. The electronic component mounting device according to claim 1, wherein
the second transfer mechanism comprises:
a removal unit which removes a plurality of the electronic components from the alignment portion by simultaneously sucking the plurality of the electronic components in one row; and
a temporary storage portion to which the plurality of the electronic components in the one row, having been removed by the removal unit, are delivered, and
the mounting and transfer mechanism sucks the plurality of the electronic components in the one row, having been delivered to the temporary storage portion, and mounts the electronic devices on the attachments.

4. The electronic component mounting device according to claim 3, wherein
the second transfer mechanism further comprises an inversion unit on which the plurality of the electronic components in the one row are placed from the removal unit, and which inverts the electronic components placed thereon and delivers the electronic components to the temporary storage portion.

5. The electronic component mounting device according to claim 3, wherein
the temporary storage portion comprises a correction unit which corrects positions of the electronic components placed in the temporary storage portion.

6. The electronic component mounting device according to claim 1, wherein
the second transfer mechanism simultaneously sucks a plurality of rows of the electronic components from the alignment portion.

7. The electronic component mounting device according to claim 1, wherein
the second transfer mechanism simultaneously places a plurality of rows of the electronic components on the attachments.

8. The electronic component mounting device according to claim 1, wherein
the alignment portion moves the positioned electronic components between: a first delivery position at which the electronic components are delivered from the first transfer mechanism, and a second delivery position at which the electronic components are delivered to the second transfer mechanism.

9. The electronic component mounting device according to claim 1, wherein
the plurality of the electronic components held by the second transfer mechanism are arranged in a direction parallel to a direction in which the plurality of the attachments on which the electronic components are to be mounted are arranged.

10. The electronic component mounting device according to claim 1, wherein
the transport mechanism comprises a plurality of alignment portions, each being capable of being disposed at a placement position and a removal position.

11. The electronic component mounting device according to claim 1, wherein
the second transfer mechanism transports the electronic components while maintaining the certain intervals between the electronic components.

12. The electronic component mounting device according to claim 1, wherein
the second transfer mechanism transports a plurality of rows of the electronic components when performing one transportation operation, with interval patterns in the plurality of rows of the electronic components being different from each other.

13. The electronic component mounting device according to claim 1, wherein
the removal mechanism removes the plurality of the electronic components while the plurality of the electronic components is being arranged in one column.

14. The electronic component mounting device according to claim 1, wherein
the electronic components each include an IC chip to be used for an RFID device or a strap on which an IC chip is mounted.

15. The electronic component mounting device according to claim 1, wherein
the plurality of the electronic components are placed in close contact with one another in the predetermined portion.

16. The electronic component mounting device according to claim 1, wherein
the removal mechanism removes the electronic components by sucking and holding the electronic components.

17. The electronic component mounting device according to claim 1, wherein
the mounting and transfer mechanism mounts the electronic components on the predetermined positions of the attachments such that the electronic components are arranged at the same height.

18. The electronic component mounting device according to claim 1, further comprising
an attachment position verification member configured to verify the predetermined positions of the attachments before the electronic components are mounted.

19. The electronic component mounting device according to claim 1, wherein
the predetermined positions are located in a repeating pattern with intervals which differ in a row direction.

20. The electronic component mounting device according to claim 1, wherein
a pattern in which the electronic components are arranged at the certain intervals is repeated in a row direction.

21. The electronic component mounting device according to claim 1, wherein
a pattern in which the electronic components are arranged at the certain intervals is not repeated in a row direction.

* * * * *